United States Patent
Pidin

(10) Patent No.: US 8,395,222 B2
(45) Date of Patent: Mar. 12, 2013

(54) MOS TRANSISTOR, MANUFACTURING METHOD THEREOF, AND SEMICONDUCTOR DEVICE

(75) Inventor: Sergey Pidin, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 42 days.

(21) Appl. No.: 13/075,691

(22) Filed: Mar. 30, 2011

(65) Prior Publication Data

US 2011/0316087 A1  Dec. 29, 2011

(30) Foreign Application Priority Data

Jun. 23, 2010 (JP) ................. 2010-142936

(51) Int. Cl.
*H01L 21/70* (2006.01)

(52) U.S. Cl. ........... 257/369; 257/288; 257/E27.062; 257/E29.242

(58) Field of Classification Search ........... 257/369, 257/E29.409, E29.242, E27.062, 288
See application file for complete search history.

(56) References Cited

U.S. PATENT DOCUMENTS

2008/0054366 A1* 3/2008 Pidin ............... 257/371
2009/0298245 A1* 12/2009 Doris et al. ........ 438/216

FOREIGN PATENT DOCUMENTS

JP  2007-123439 A  5/2007

OTHER PUBLICATIONS

Mayuzumi S. et al. "High-Performance Metal/High-k n- and p-MOSFETs With Top-Cut Dual Stress Liners Using Gate-Last Damascene Process on (100) Substrates," IEEE Transactions on Electron Devices, Apr. 2009, vol. 56, No. 4, pp. 620-626.

* cited by examiner

*Primary Examiner* — Kimberly Rizkallah
*Assistant Examiner* — Timor Karimy
(74) *Attorney, Agent, or Firm* — Westerman, Hattori, Daniels & Adrian, LLP

(57) ABSTRACT

A MOS transistor has a first stress layer formed over a silicon substrate on a first side of a channel region defined by a gate electrode, and a second stress layer formed over the silicon substrate on a second side of the channel region, the first and second stress layers accumulating a tensile stress or a compressive stress depending on a conductivity type of the MOS transistor. The first stress layer has a first extending part rising upward from the silicon substrate near the channel region along a first sidewall of the gate electrode but separated from the first sidewall of the gate electrode, and the second stress layer has a second extending part rising upward from the silicon substrate near the channel region along a second sidewall of the gate electrode but separated from the second sidewall of the gate electrode. The accumulated stress is the tensile stress if the conductivity type is an n-type, and is a compressive stress if the conductivity type is a p-type.

8 Claims, 25 Drawing Sheets

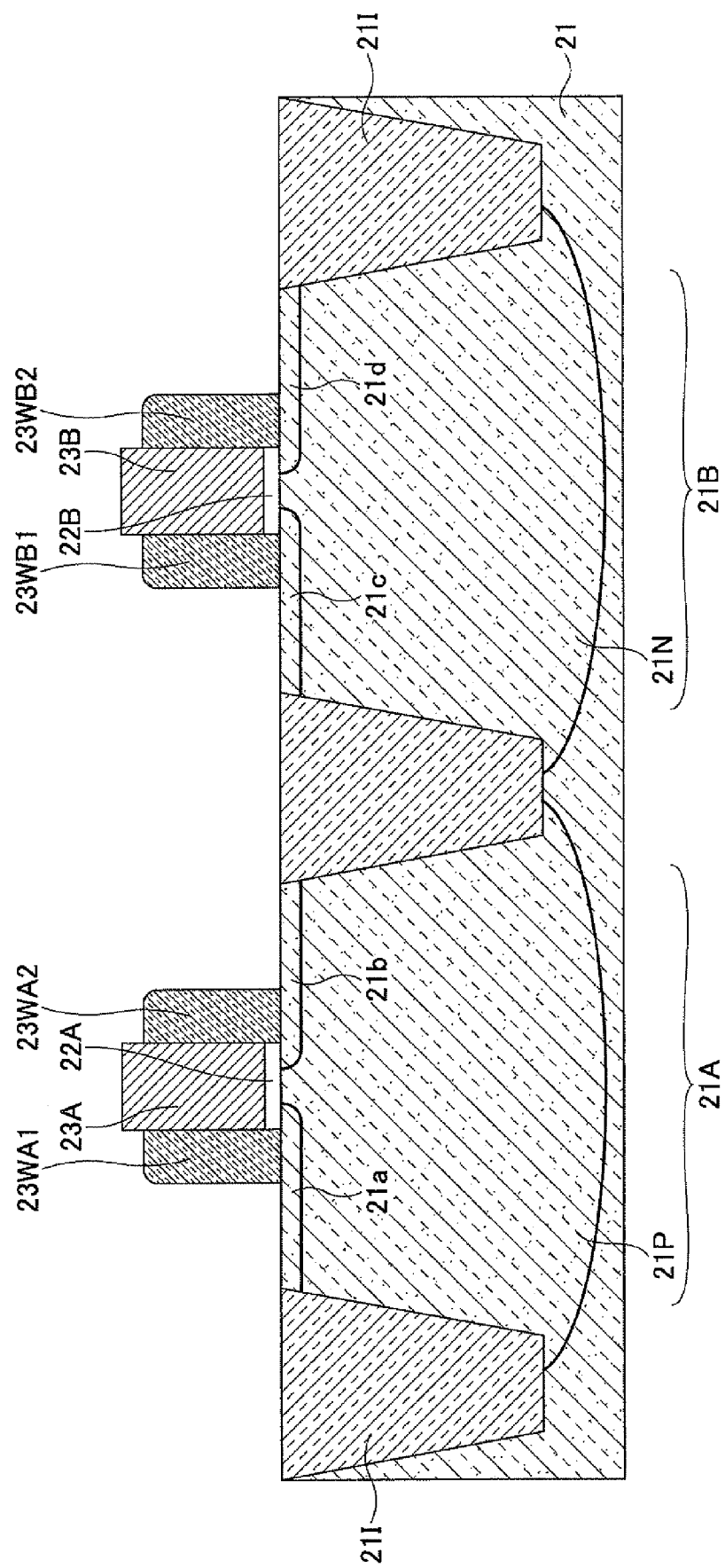

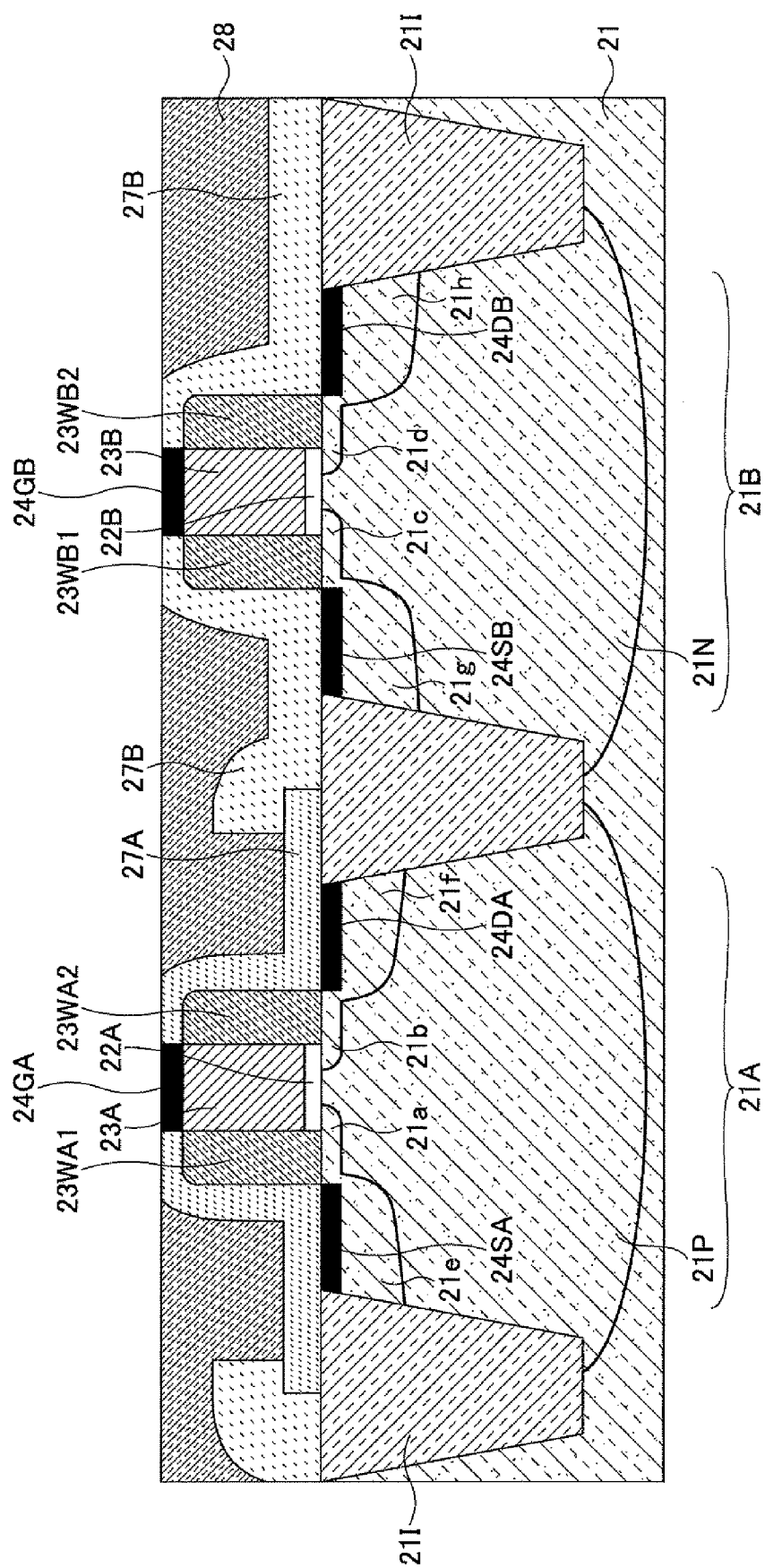

MOS TRANSISTOR, MANUFACTURING METHOD THEREOF, AND SEMICONDUCTOR DEVICE

BACKGROUND OF THE INVENTION

1. Field of the Invention

The present invention generally relates to a semiconductor device and a manufacturing method thereof.

2. Description of the Related Art

Along with advancement in miniaturization technologies, highly scaled high-speed semiconductor devices with a gate length less than 50 nm have been realized.

In such a highly scaled high-speed transistor, the area of the channel region below the gate electrode is very small, and the electron mobility or hole mobility across the channel region is greatly influenced by a stress applied to the channel region. Many research and study efforts have been made to optimize the stress applied to a channel region to improve the operational speed of the semiconductor device. See, for example, JP 2007-123439 A, or Mayuzumi, S., et al., IEEE Trans Electron Devices Vol. 56, No. 4, pp. 620-626, 2009.

To improve the operating speed of an re-channel MOS transistor, a technique of forming a tensile stress layer in the device region of the re-channel MOS transistor so as to cover the gate electrode is well-known. This structure can improve the electron mobility across the channel region.

For a p-channel MOS transistor, a compressive stress layer is formed in the device region of the p-channel MOS transistor so as to cover the gate electrode to improve hole mobility across the channel region.

In the n-channel MOS transistor, the tensile stress layer induces tensile strain in the channel region in the direction of gate length. As a result, the electron mobility, and accordingly, the operating speed of the n-channel MOS transistor increase.

In the p-channel MOS transistor, the compressive stress induces compressive strain in the channel region along the channel direction. As a result, the hole mobility in the channel increases, accordingly the operating speed of the p-channel MOS transistor increases.

With a conventional n-channel or p-channel MOS transistor, the stress layer formed for the corresponding gate electrode extends on the silicon substrate near the channel region. In the area near the channel region of, for example, n-channel MOS transistor, a tensile stress acts directly on the surface of the silicon substrate. Similarly, in the area near the channel region of the p-channel MOS transistor, a compressive stress acts directly on the surface of the silicon substrate.

However, in the conventional n-channel transistor and p-channel MOS transistor, the tensile stress layer and the compressive stress layer are attached to the side walls of the corresponding gate electrodes. For this reason, the tensile stress or the compressive stress cannot be efficiently transferred to the silicon substrate.

SUMMARY OF THE INVENTION

Accordingly, it is an object in the embodiments presented below to provide a structure of a semiconductor device and a method of manufacturing the same that can transfer a stress of the tensile stress layer or the compressive stress layer to the silicon substrate in an efficient manner. Particularly, a structure and a method that can efficiently transfer a tensile stress to the channel region of an n-channel MOS transistor and transfer a compressive stress to the channel region of a p-channel MOS transistor is provided.

In one aspect of the embodiments, a MOS transistor comprises a silicon substrate in which a device region is defined by a device isolation region; a gate electrode formed over the silicon substrate using a gate insulator film in the device region and providing a channel region in the silicon substrate; a source extension region and a drain extension region formed in the silicon substrate on a first side of the channel region and a second side of the channel region, respectively, in the device region, the source extension region and the drain extension region being of a first conductivity type corresponding to one of an n-type and a p-type; a first conductivity-type source region formed in the silicon substrate on said first side of the channel region in the device region so as to be apart from the channel region and overlap a part of the source extension region; a first conductivity-type drain region formed in the silicon substrate on said second side of the channel region in the device region so as to be apart from the channel region and overlap a part of the drain extension region; a first stress layer formed over the silicon substrate in the device region so as to cover the source region and extending from the device isolation region toward the channel region on said first side of the channel region, the first stress layer accumulating a first stress corresponding to one of a tensile stress and a compressive stress; and a second stress layer formed over the silicon substrate in the device region so as to cover the drain region and extending from the device isolation region toward the channel region on said second side of the channel region, the second stress layer accumulating said first stress, said first stress layer having a first extending part rising from an end of the first stress layer near the channel region upward from the silicon substrate along a first sidewall of the gate electrode but separated from the first sidewall of the gate electrode, said second stress layer having a second extending part rising from an end of the second stress layer near the channel region upward from the silicon substrate along a second sidewall of the gate electrode but separated from the second sidewall of the gate electrode, said first stress being the tensile stress if the first conductivity type is the n-type, and said first stress being the compressive stress if the first conductivity type is the p-type.

In a second aspect of the embodiment, a semiconductor integrated circuit is provided. The semiconductor integrated circuit comprises a silicon substrate in which a first device region and a second device region are defined by a device isolation region; an n-channel MOS transistor formed in the first device region; and a p-channel MOS transistor formed in the second device region. The n-channel MOS transistor comprises a first gate electrode formed over the silicon substrate using a gate insulator film in the first device region and providing a first channel region in the silicon substrate; an n-type source extension region and an n-type drain extension region formed in the silicon substrate on a first side and a second side of the first channel region, respectively, in the first device region; an n-type source region formed in the silicon substrate on said first side of the first channel region in the first device region so as to be apart from the first channel region and overlap a part of the n-type source extension region; an n-type drain region formed in the silicon substrate on said second side of the first channel region in the first device region so as to be apart from the first channel region and overlap a part of the n-type drain extension region; a first tensile stress layer formed over the silicon substrate in the first device region so as to cover the n-type source region and extending from the device isolation region toward the first channel region on said first side of the first channel region; and a second tensile stress layer formed over the silicon substrate in the first device region so as to cover the n-type drain region and extending from the device isolation region toward the first channel region on said second side of the first channel region, said first tensile stress layer having a first extending part rising from an end of the first tensile stress layer near the first channel region upward from the silicon substrate along a first sidewall of the first gate electrode but separated from the first sidewall of the first gate electrode on said first side of the first channel region, and said second stress layer having a second extending part rising from an end of the second tensile stress layer near the channel region upward from the silicon substrate along a second sidewall of the first gate electrode but separated from the second sidewall of the first gate electrode on said second side of the first channel region. The p-channel MOS transistor comprises a second gate electrode formed over the silicon substrate using a gate insulator film in the second device region and providing a second channel region in the silicon substrate; a p-type source extension region and a p-type drain extension region formed in the silicon substrate on a first side and a second side of the second channel region, respectively, in the second device region; a p-type source region formed in the silicon substrate on said first side of the second channel region in the second device region so as to be apart from the second channel region and overlap a part of the p-type source extension region; a p-type drain region formed in the silicon substrate on said second side of the second channel region in the second device region so as to be apart from the second channel region and overlap a part of the p-type drain extension region; a first compressive stress layer formed over the silicon substrate in the second device region so as to cover the p-type source region and extending from the device isolation region toward the second channel region on said first side of the second channel region; and a second compressive stress layer formed over the silicon substrate in the second device region so as to cover the p-type drain region and extending from the device isolation region toward the second channel region on said second side of the second channel region, said first compressive stress layer having a third extending part rising from an end of the first compressive stress layer near the second channel region upward from the silicon substrate along a first sidewall of the second gate electrode but separated from the first sidewall of the second gate electrode on said first side of the second channel region, and said second stress layer having a fourth extending part rising from an end of the second compressive stress layer near the second channel region upward from the silicon substrate along a second sidewall of the second gate electrode but separated from the second sidewall of the second gate electrode on said second side of the second channel region.

In a third aspect of the embodiment, a method of manufacturing a MOS transistor is provided.

The method comprises:

forming a gate electrode over a silicon substrate using a gate insulator film in a device region defined by a device isolation region in the silicon substrate;

ion-implanting first conductivity-type impurities in the silicon substrate in the device region to form a first conductivity-type source extension region and a first conductivity-type drain extension region on a first side and a second side of a channel region provided directly below the gate electrode, respectively, the first conductivity-type corresponding to n-type or p-type;

forming a first offset sidewall spacer and a second offset sidewall spacer on a first sidewall and a second sidewall of the gate electrode, respectively, the first sidewall of the gate electrode being located on a first side of the channel region and the second sidewall of the gate electrode being located on a second side of the channel region;

ion-implanting first conductivity-type impurities in the silicon substrate using the gate electrode and the first and second offset spacers as a mask to form a first conductivity-type source region and a first conductivity-type drain region on the first side and the second side of the channel region, respectively, such that the first conductivity-type source region is apart from the channel region and overlap a part of the source extension region and that the first-conductivity-type drain region is apart from the channel region and overlap a part of the drain extension region;

forming a stress layer over the silicon substrate, covering the first offset sidewall spacer, the gate electrode, and the second offset sidewall spacer, the stress layer accumulating a first stress corresponding to one of a tensile stress and a compressive stress;

forming a protection layer over the silicon substrate covering the stress layer;

performing chemical mechanical polishing on the protection layer to expose a part of the stress layer covering the first and second offset sidewall spacers and the gate electrode;

patterning by etching the exposed part of the stress layer to separate the stress layer into a first stress layer located on the first side of the channel region and extending along the first offset sidewall spacer and a second stress layer located on the second side of the channel region and extending along the second offset sidewall spacer, the first stress layer and the second stress layer accumulating the first stress, and to expose top faces of the first and second offset sidewall spacers; and removing by etching the first and second offset sidewall spacers from the top faces thereof to produce a first gap between the first sidewall of the gate electrode and a first extending part of the first stress layer arising upward from the silicon substrate along the first sidewall of the gate electrode, and a second gap between the second sidewall of the gate electrode and a second extending part of the second stress layer arising upward from the silicon substrate along the second sidewall of the gate electrode, said first stress being the tensile stress if the first conductivity type is the n-type, and said first stress being the compressive stress if the first conductivity type is the p-type.

According to the first through third aspects, sufficient stress can be applied by a stress layer formed over the substrate to the channel region of a MOS transistor in an efficient manner. Consequently, the operational speed of the MOS transistor can be improved.

Other objects, features, and advantages of the present invention will be come more apparent from the following detailed description when read in conjunction with the accompanying drawings.

BRIEF DESCRIPTION OF THE DRAWINGS

FIG. 6A is a schematic cross-sectional view showing a manufacturing process of a CMOS device according to the second embodiment of the invention;

FIG. 6F is a schematic cross-sectional view showing a manufacturing process of a CMOS device according to the second embodiment of the invention;

DETAILED DESCRIPTION OF THE PREFERRED EMBODIMENTS

A description is given below, with reference to the FIG. 1 through FIG. 10 of embodiments of the present invention.

First Embodiment

Figure 1:
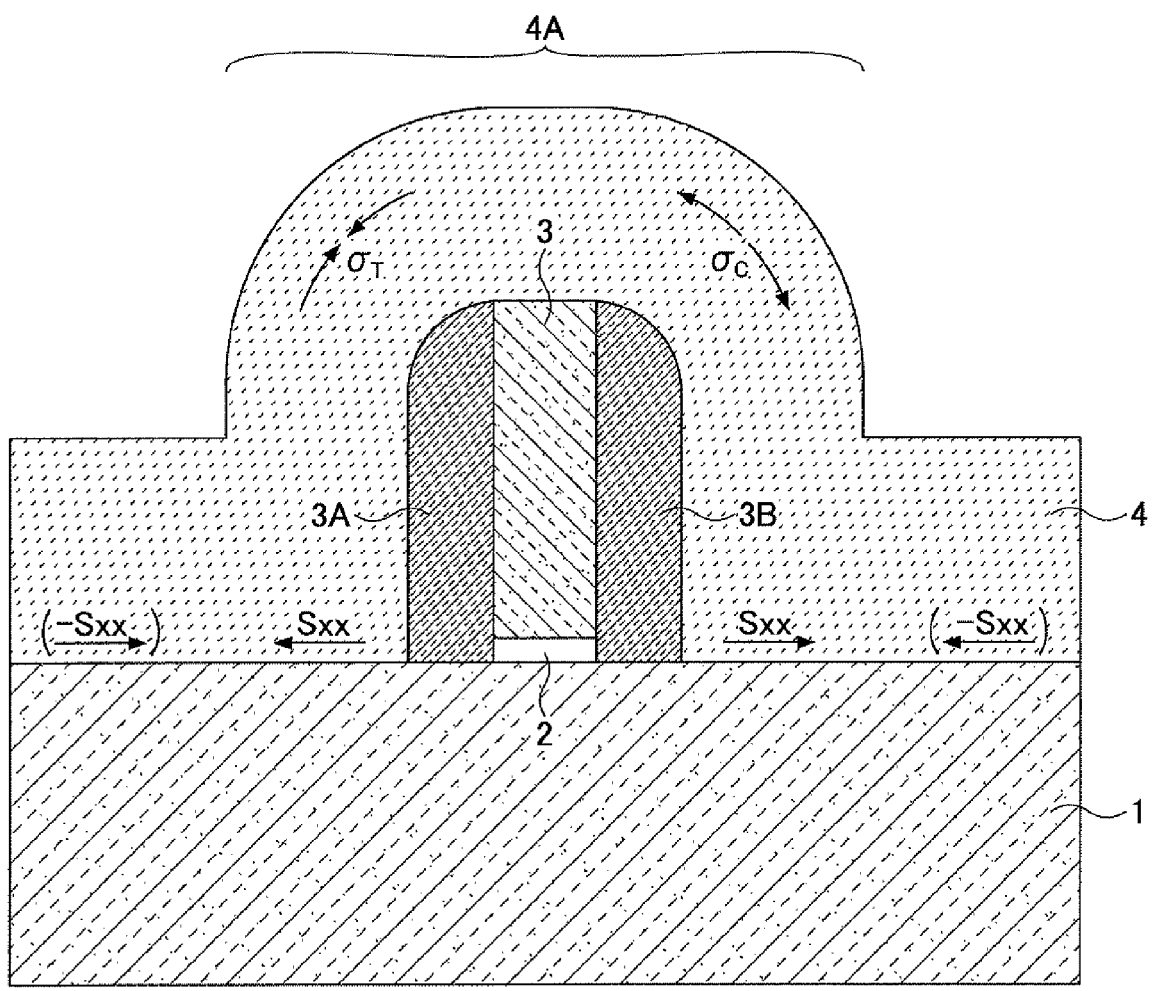
FIG. 1 is a cross-sectional view of a semiconductor device of a first embodiment of the present invention, illustrating a device structure.

FIG. 1 is a cross-sectional diagram showing a model structure used in the stress analysis according to the first embodiment.

A polysilicon gate electrode 3 with a gate length of 30 nm to 35 nm and a height of 60 nm to 120 nm is formed over a silicon substrate 1 using a gate insulator film 2 with a thickness of 1.1 nm to 1.2 nm. A first offset sidewall 3A and a second offset sidewall 3B are provided. The first and second offset sidewalls 3A and 3B have thickness of 30 nm to 60 nm, and rise from the surface of the silicon substrate 1 to the top of the polysilicon gate electrode 3.

A silicon nitride (SiN) stress layer 4 is provided over the silicon substrate 1 so as to continuously cover the first offset sidewall 3A, the gate electrode 3, and the second offset sidewall 3B, extending from the left-hand side of the first offset sidewall 3A to the right-hand side of the second offset sidewall 3B in the figure. Especially, a top part 4A of the stress layer 4 continuously covers the top of the first offset sidewall 3A, the top of the polysilicon gate electrode 3, and the top of the second offset sidewall 3B. The stress layer 4 may have a tensile stress σT or compressive stress σC.

Figure 2A:
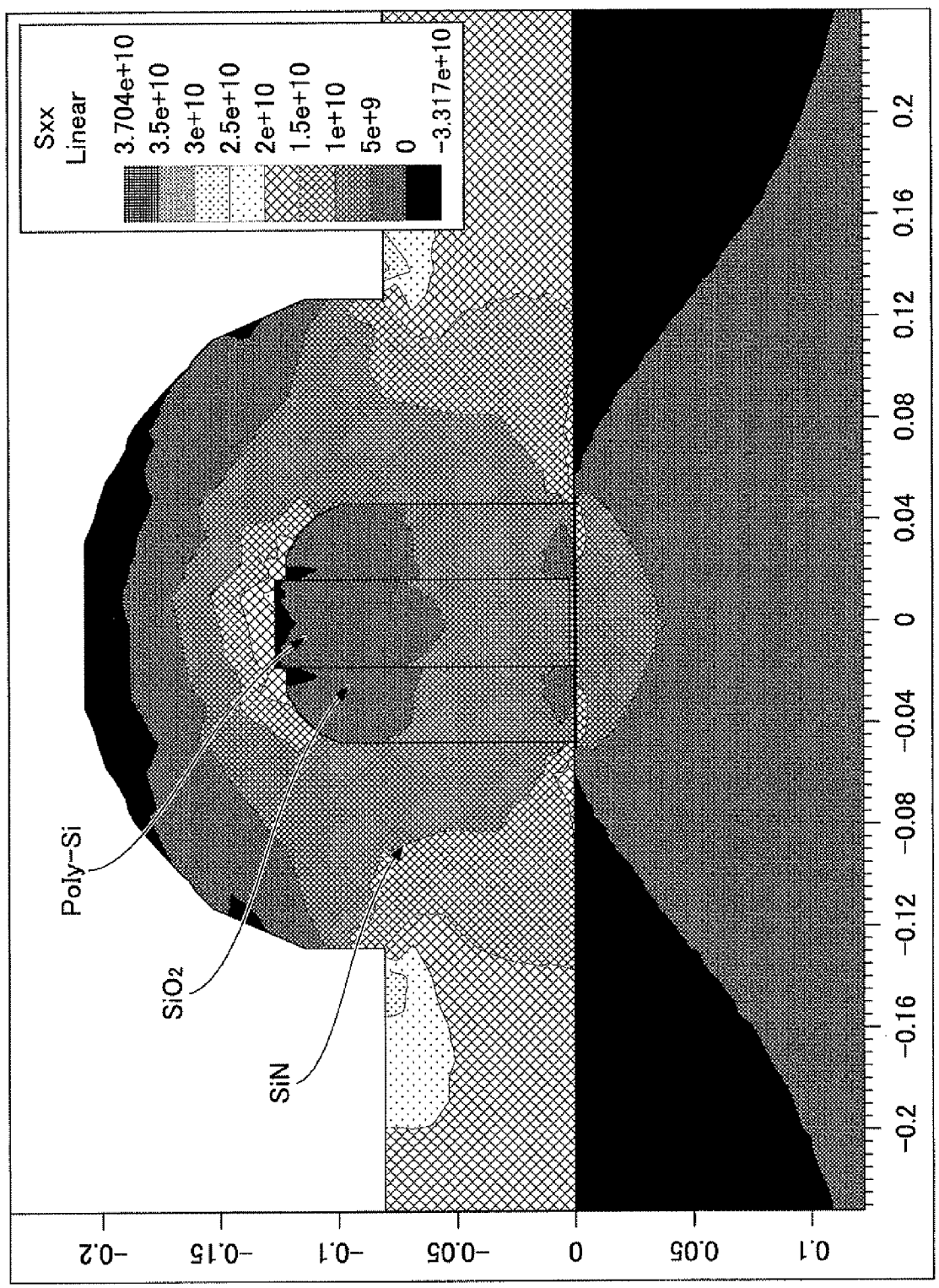
FIG. 2A is a diagram showing a stress analysis result based upon the device structure of FIG. 1 when the stress layer is a tensile stress layer.
Figure 2B:
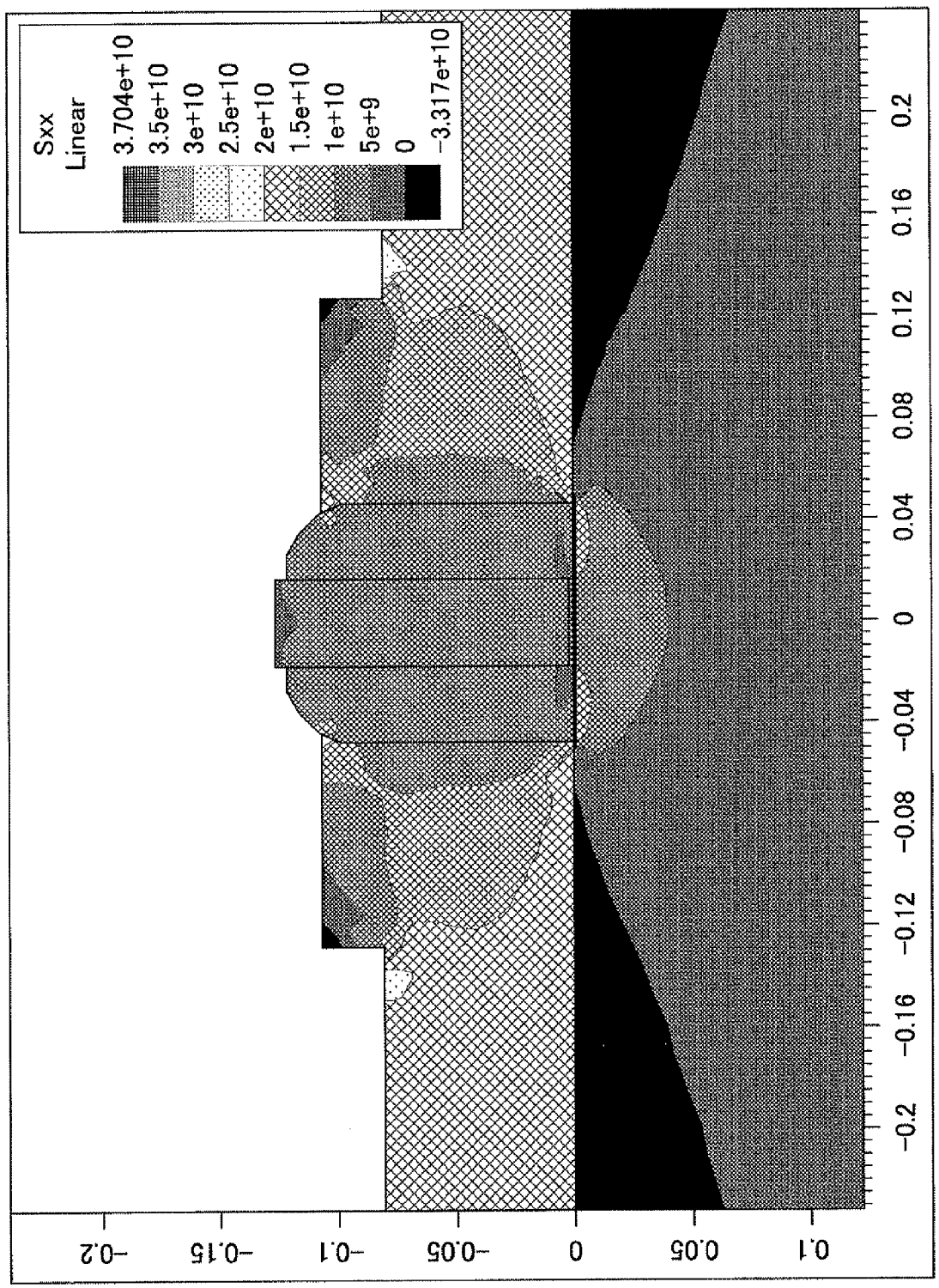
FIG. 2B is a diagram showing a stress analysis result based upon the device structure of FIG. 1 when the stress layer is a tensile stress layer.
Figure 2C:
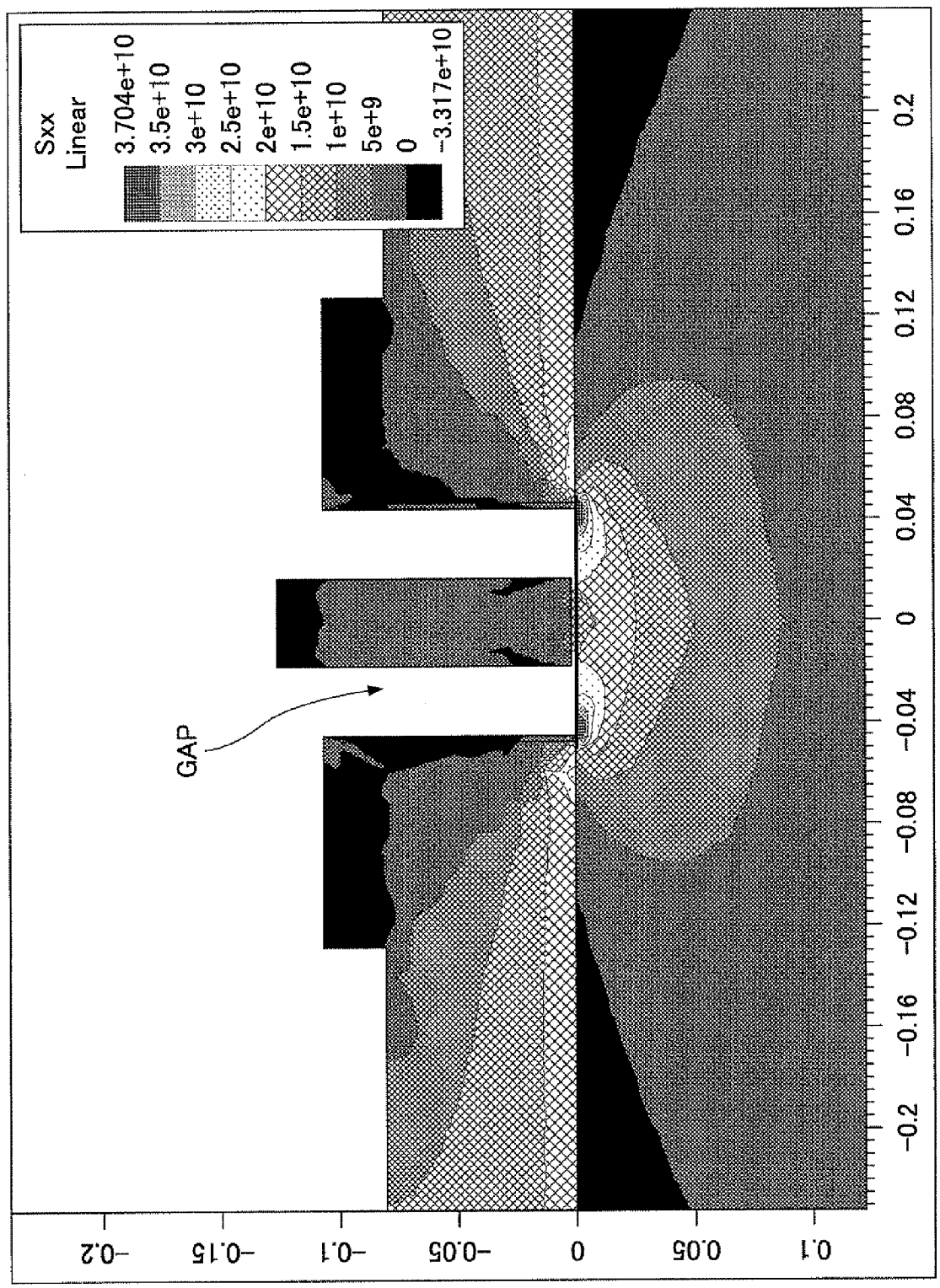
FIG. 2C is a diagram showing a stress analysis result based upon the device structure of FIG. 1 when the stress layer is a tensile stress layer.

FIG. 2A shows a simulation result of distribution of tensile stress Sxx (see FIG. 1) acting in the channel direction when the stress layer 4 is a tensile stress layer. FIG. 2B and FIG. 2C are diagrams of simulation results for different transistor structures. Simulations of FIG. 2A through FIG. 2C were performed using process simulation software "TSUPREM 4", under the condition that a tensile stress of 1.6 GPa to 2.0 GPa is accumulated in the stress layer 4. In FIG. 2A, the regions subjected to less tensile stress Sxx are darkened, while regions subjected to greater tensile stress Sxx are depicted as bright areas. According to the legend of FIG. 2A, a region with very large tensile stress will also be depicted as a darkened area; however, there is no such region existing in FIG. 2A. Detailed analysis based upon the actual stress values will be made below in conjunction with FIG. 3.

In FIG. 2A, under the influence of the tensile stress layer 4, the gate electrode 3 is pressed against the silicon substrate 1. It is understood from the figure that the stress Sxx is increased in the channel region directly below the gate electrode 3. In addition, the tensile stress layer 4 pulls the silicon substrate 1 toward the directions away from the channel region from the outer sides of the offset sidewalls 3A and 3B.

In the simulation of FIG. 2B, tensile stress Sxx acting on each site of the model is calculated under the condition that the top part 4A of the stress layer 4 extending continuously over the top of the offset sidewall 3A, the top of the gate electrode 3 and the top of the offset sidewall 3B is removed.

With the structure of FIG. 2B, there is little force acting on the top portions of the polysilicon gate electrode 3 and the offset sidewalls 3A and 3B to press the gate electrode 3 against the silicon substrate 1. It is speculated that the tensile stress Sxx acting on the channel region in FIG. 2B is caused mainly by the remaining part of the stress layer 4 (i.e., the part other than the removed top part 4A) to directly pull the offset sidewall spacers 3A and 3B toward the left-hand side and the right-hand side of the figure, respectively. In fact, in FIG. 2B, although the tensile stress Sxx accumulated in the polysilicon gate electrode 3 and the offset sidewall spacers 3A and 3B is increased as compared to the structure of FIG. 2A, there is little difference in the tensile stress applied to the channel region between FIG. 2A and FIG. 2B.

It is presumed that one reason for these results is that the offset sidewalls 3A and 3B cannot be displaced by the tensile stress applied from the stress layer 4 to the offset sidewall spacers 3A and 3B in the directions apart from each other, because the offset sidewalls 3A and 3B are attached to the gate electrode 3. For this reason, there is no substantial change occurring in the tensile stress applied to the channel region in the silicon substrate 1.

To confirm this assumption, another simulation was performed as shown in FIG. 2C under the same conditions as those in FIG. 2B, except that the offset sidewall spacers 3A and 3B are removed.

In FIG. 2C, a large change has occurred in the stress distribution in the channel regions, and it is confirmed that the tensile stress Sxx is greatly increased.

Figure 3:
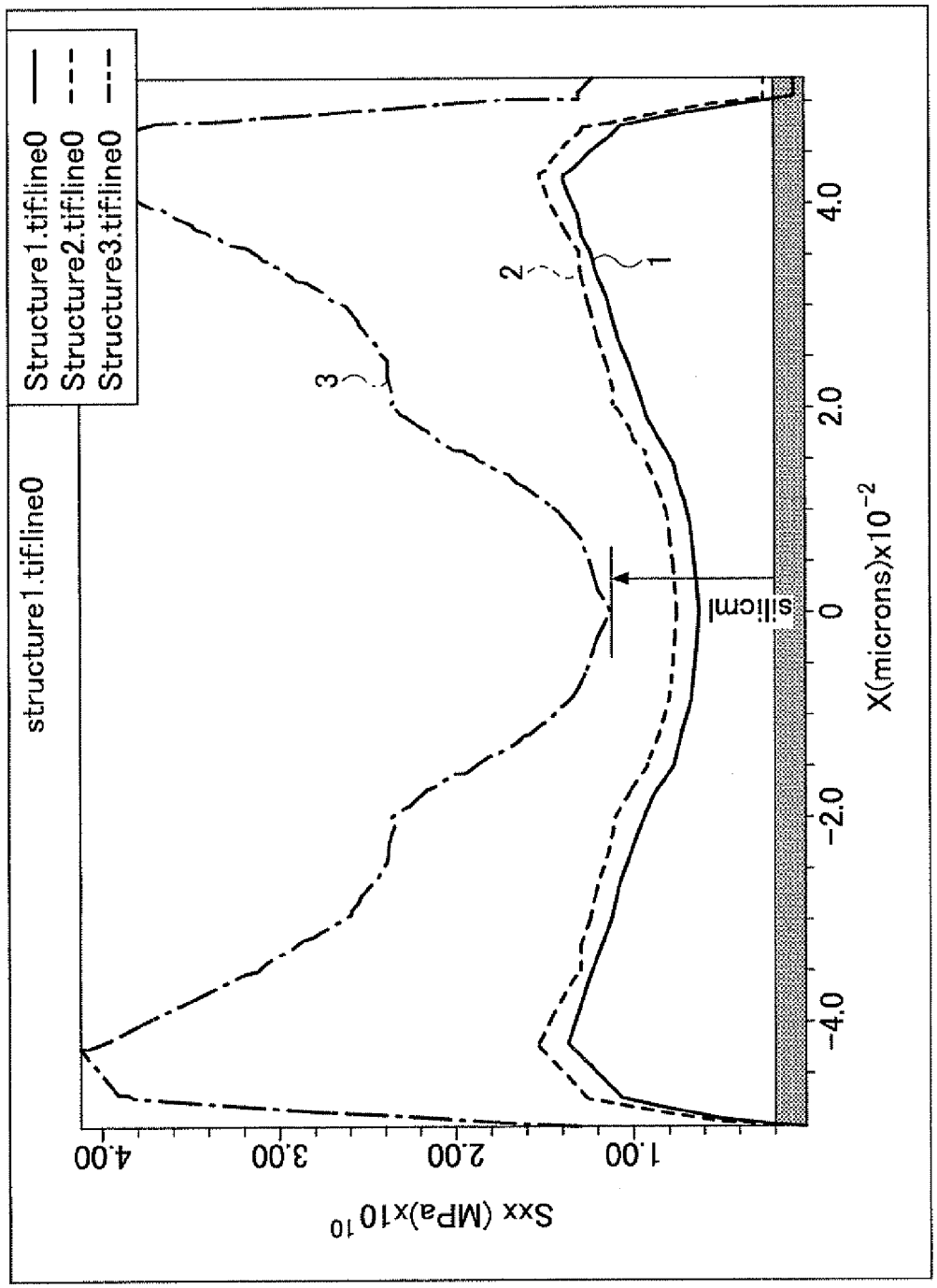
FIG. 3 is a diagram summarizing the analysis results of FIG. 2A through FIG. 2C together in one graph.

FIG. 3 is a graph showing the distributions of the tensile stress Sxx induced in the surface of the silicon substrate 1 of the structures shown in FIG. 2A, FIG. 2B and FIG. 2C using the model of FIG. 1. The horizontal axis represents a distance by $1/100$ microns along the gate length from the center of the channel set to the origin of 0.0, and the vertical axis represents the amplitude of tensile stress Sxx by $10^{10}$ MPas. The bottom end of the graph indicates the zero stress state, and the tensile stress increases along the vertical axis.

In FIG. 3, the line 1 indicates the stress distribution of FIG. 2A, the line 2 indicates the stress distribution of FIG. 2B and the line 3 indicates the stress distribution of FIG. 2C. The structure of FIG. 2C exhibits the tensile stress Sxx in the channel region almost double the tensile stresses of FIG. 2A and FIG. 2B.

In the graph of FIG. 3, the tensile stress Sxx becomes maximum at the positions about ±0.04 μm from the center of the channel along the channel length. These positions correspond to the outer-most edges of the offset sidewalls 3A and 3B. Particularly, at these positions, the tensile stress Sxx of FIG. 2C becomes triple of those of FIG. 2A and FIG. 2B. This effect is achieved by removing the offset sidewall spacers 3A and 3B after the formation of the stress layer 4. Because the offset sidewall spacer 3A and 3B are removed, the stress layer 4 becomes displaceable in the area beyond the outer-most edge positions of the previously existed offset sidewalls, and it can efficiently pull the silicon substrate 1 in the right and the left directions with respect to the center of the channel along the channel length.

The same tendency is observed in the model structure of FIG. 1 when the stress layer is a compressive stress.

Figure 4A:
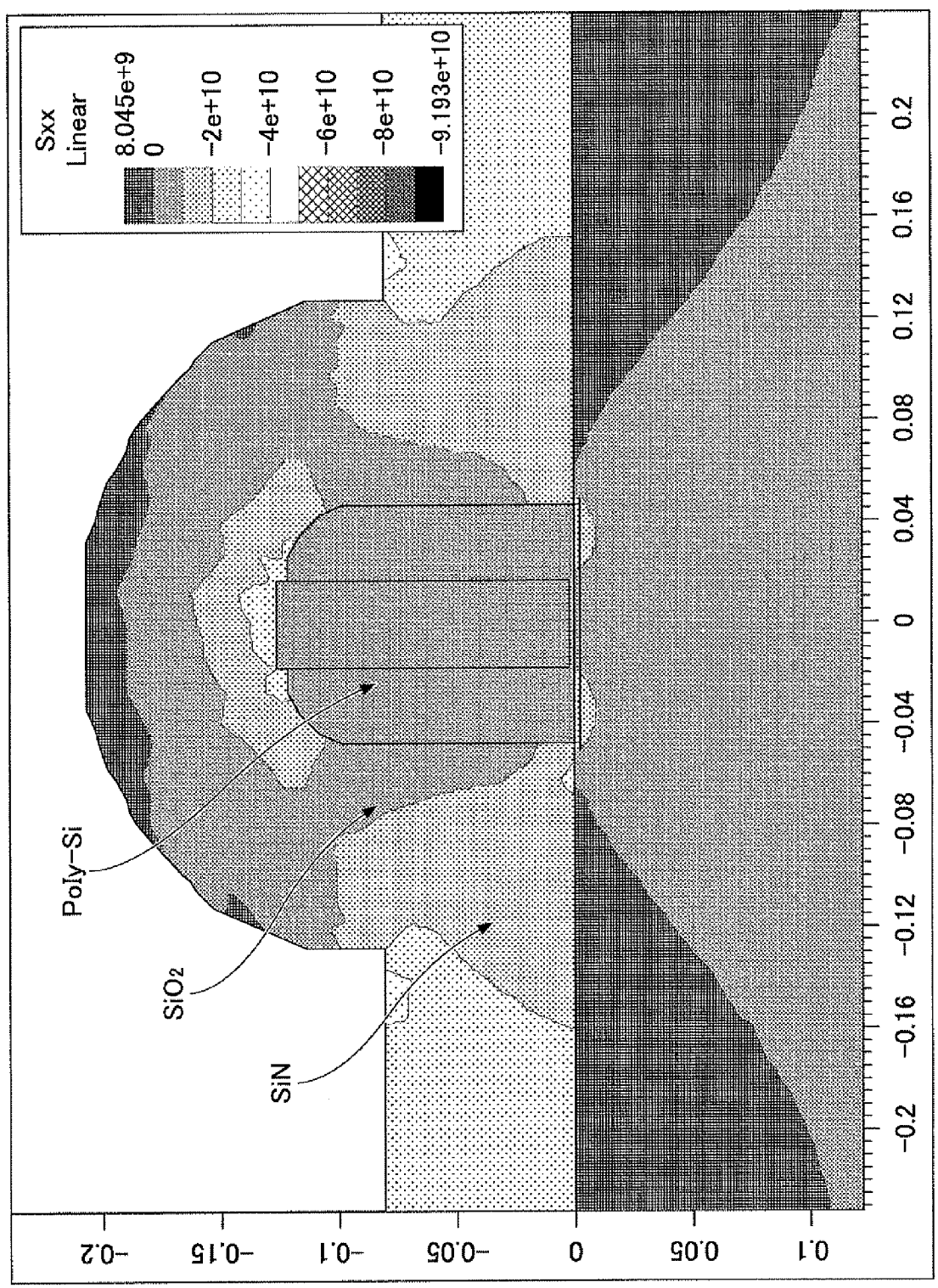
FIG. 4A is a diagram showing a stress analysis result based upon the device structure of FIG. 1 when the stress layer is a compressive stress layer.
Figure 4B:
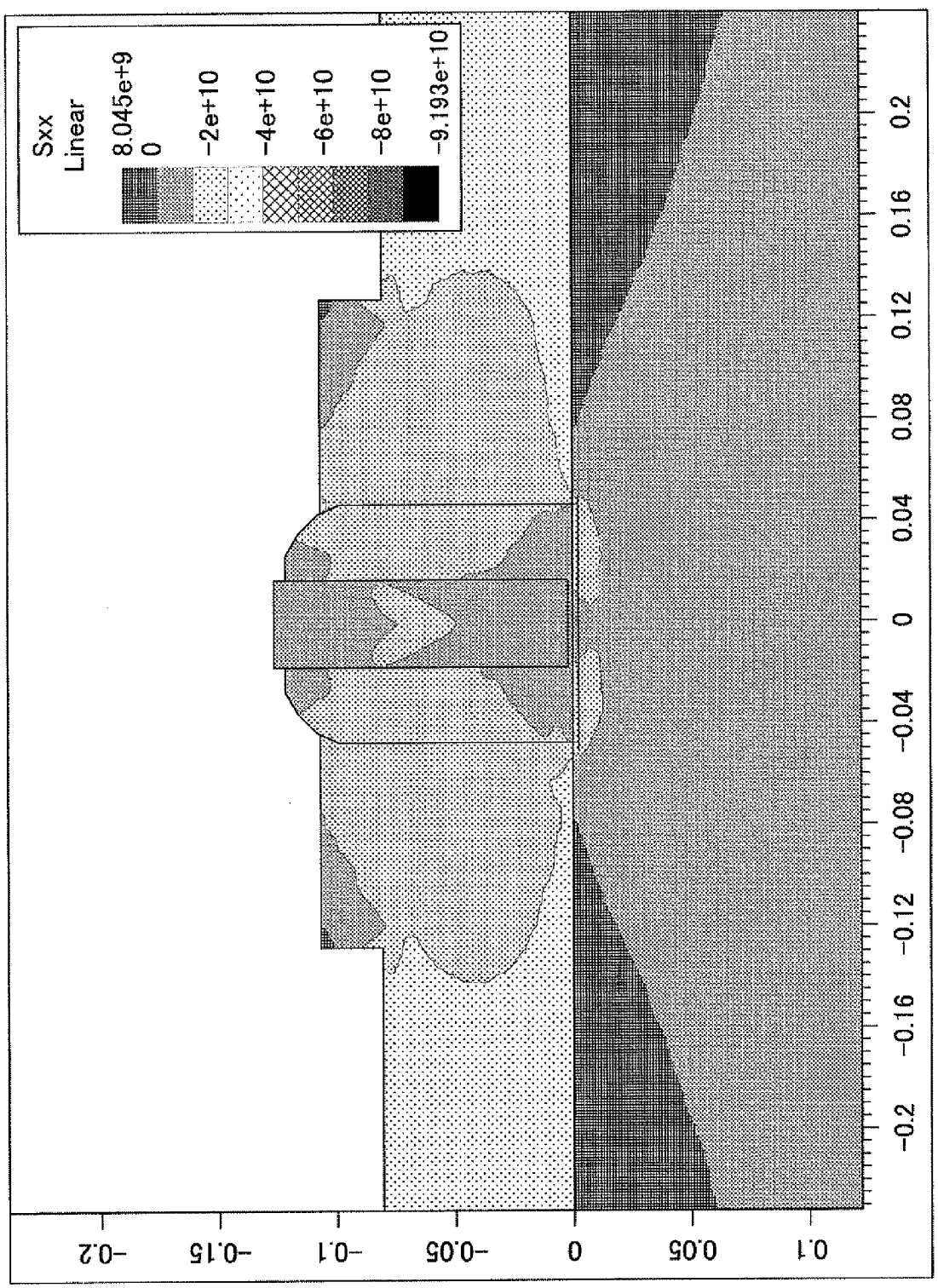
FIG. 4B is a diagram showing a stress analysis result based upon the device structure of FIG. 1 when the stress layer is a compressive stress layer.
Figure 4C:
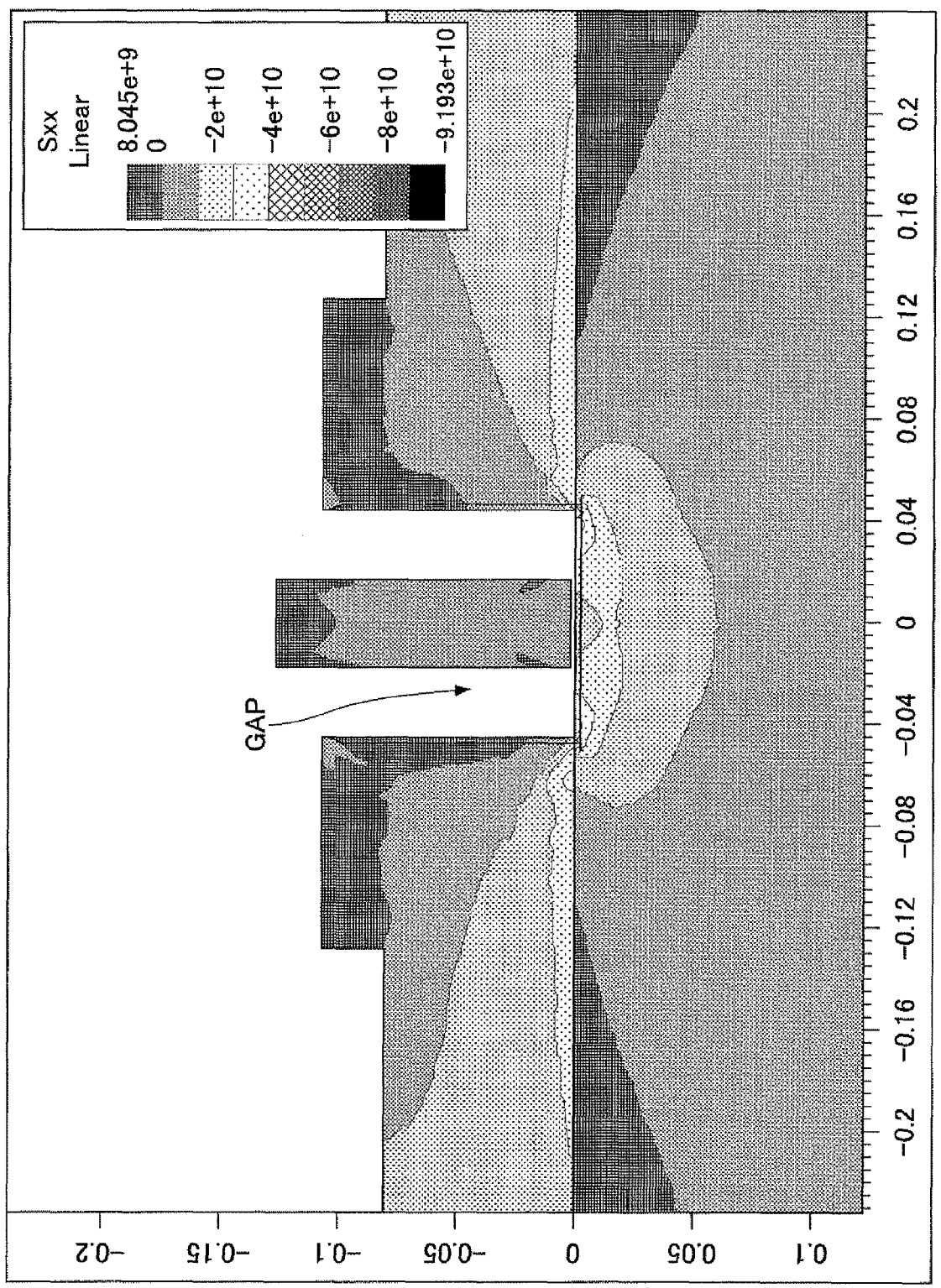
FIG. 4C is a diagram showing a stress analysis result based upon the device structure of FIG. 1 when the stress layer is a compressive stress layer.

FIG. 4A shows a simulation result of distribution of compressive stress −Sxx (see FIG. 1) acting in the channel direction when the stress layer 4 is a compressive stress layer. FIG. 4B and FIG. 4C are also diagrams of simulation results for different transistor structures. Simulations of FIG. 4A through FIG. 4C were performed using process simulation software "TSUPREM 4", under the condition that a compressive stress of 2.5 GPa to 3.5 GPa is accumulated in the stress layer 4. In FIG. 4A, the regions subjected to less compressive stress −Sxx are darkened, while regions subjected to greater compressive stress −Sxx are depicted as bright areas. According to the scale of FIG. 4A, a region with very large compressive stress accumulated will also be depicted as a darkened area; however, there is no such region existing in FIG. 4A. Detailed analysis based upon the actual stress values will be made below in conjunction with FIG. 5.

In FIG. 4A, under the influence of the compressive stress layer 4, the gate electrode 3 is forced in the direction apart from the silicon substrate 1. It is understood from the figure that the compressive stress −Sxx is slightly increased in the channel region directly below the gate electrode 3. In addition, the compressive stress layer 4 pushes the silicon substrate 1 toward the channel region from the outer sides of the offset sidewalls 3A and 3B.

In the simulation of FIG. 4B, compressive stress −Sxx acting on each point of the structure is calculated under the condition that top part 4A of the stress layer 4 extending continuously over the top of the offset sidewall 3A, the top of the gate electrode 3 and the top of the offset sidewall 3B is removed.

With the structure of FIG. 4B, there is little force acting on the top portions of the polysilicon gate electrode 3 and the offset sidewalls 3A and 3B to pull up the gate electrode 3 from the silicon substrate 1. Accordingly, it is speculated that the compressive stress −Sxx acting on the channel region in FIG. 4B is caused mainly by the remaining part of the stress layer 4 (i.e., the part other than the removed top part 4A) to directly push the offset sidewalls 3A and 3B toward the center of the channel (i.e., to the right-hand side and the left-hand side of the figure, respectively). In fact, in FIG. 4B, although the compressive stress −Sxx accumulated in the polysilicon gate electrode 3 and the offset sidewalls 3A and 3B is increased as compared to the structure of FIG. 4A, there is little difference in the compressive stress applied to the channel region between FIG. 4A and FIG. 4B.

It is assumed that one reason for these results is that the offset sidewalls 3A and 3B cannot be displaced by the compressive stress applied from the stress layer 4 to the offset sidewalls 3A and 3B toward the channel, because the offset sidewalls 3A and 3B are attached to the gate electrode 3. For this reason, there is no substantial change occurring in the compressive stress applied to the channel region in the silicon substrate 1.

To confirm this assumption, another simulation was performed as shown in FIG. 4C under the same conditions as those in FIG. 2B, except that the offset sidewalls 3A and 3B are removed. A large change has occurred in the stress distribution in the channel regions, and it is confirmed that the compressive stress −Sxx is greatly increased.

Figure 5:
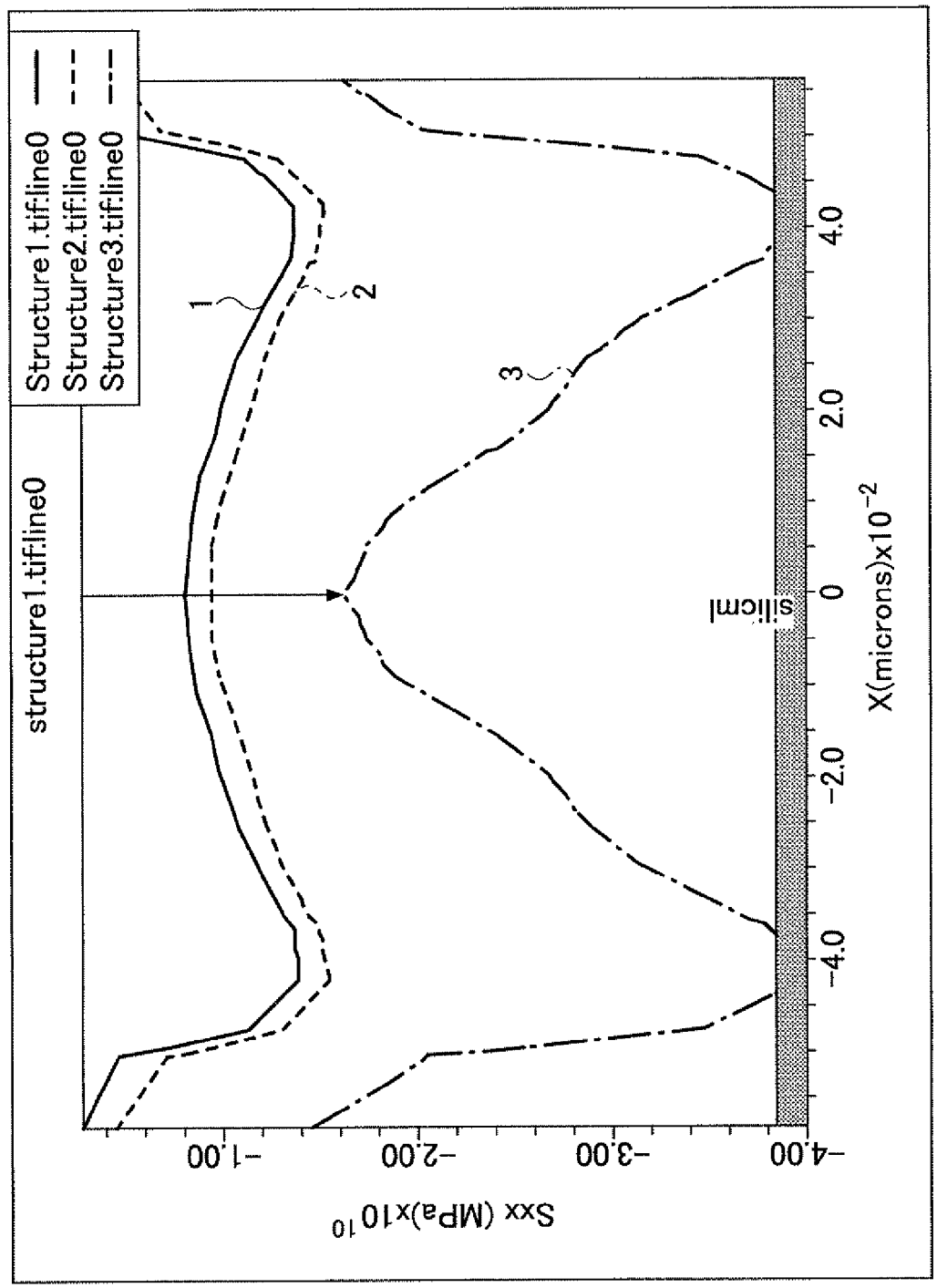
FIG. 5 is a diagram summarizing the analysis results of FIG. 4A through FIG. 4C together in one graph.

FIG. 5 is a graph showing the distributions of the compressive stress −Sxx induced in the surface of the silicon substrate 1 of the structures shown in FIG. 4A, FIG. 4B and FIG. 4C using the model of FIG. 1. The horizontal axis represents a distance by $1/100$ microns along the gate length from the center of the channel, and the vertical axis represents the amplitude of compressive stress −Sxx by $10^{10}$ MPas. The bottom end of the graph indicates the zero stress state, and the compressive stress increases as along the vertical axis.

In FIG. 5, the line 1 indicates the stress distribution of FIG. 4A, the line 2 indicates the stress distribution of FIG. 4B and the line 3 indicates the stress distribution of FIG. 4C. The structure of FIG. 4C exhibits the compressive stress −Sxx in the channel region almost double the compressive stresses of FIG. 4A and FIG. 4B.

In the graph of FIG. 5, the compressive stress −Sxx becomes maximum at positions about ±0.04 μm from the center of the channel along the channel length. These positions correspond to the outer-most edges of the offset sidewalls 3A and 3B. Particularly, at these positions, the compressive stress −Sxx of FIG. 2C becomes triple of the stress in FIG. 2A and FIG. 2B. This effect is achieved by removing the offset sidewall spacers 3A and 3B after the formation of the stress layer 4. Because the offset sidewall 3A and 3B are removed, the stress layer 4 becomes displaceable in the area beyond the outer-most edge positions of the previously existed offset sidewall spacers, and it can efficiently push the silicon substrate 1 from the left and the right toward the center of the channel along the channel length.

Second Embodiment

In the second embodiment, explanation is made of a CMOS device manufacturing method developed based upon the analysis results of the first embodiment.

First, in the example of FIG. 6A, device regions (or active regions) 21A and 21B are defined by STI isolation regions 21I in a p-type silicon substrate 21. A p-type well 21P is formed in the device region 21A and an n-type well 21N is formed in the device region 21B.

A gate insulator film 22A is formed in the device region 21A. The gate insulator film 22A includes an oxide film, such as a thermally oxidized film or a plasma oxidation film, with a thickness of 1.0 nm to 1.2 nm formed over the silicon substrate 21 and a plasma nitrided film formed over the oxide film. A polysilicon gate electrode 23A with a gate length of, for example, 30 nm to 35 nm and a height of, for example, 60 nm to 120 nm is formed over the gate insulator film 22A.

Similarly, in the device region 21B, a gate insulator film 22B is formed over the silicon substrate 21, and a polysilicon gate electrode 23B with a gate length of, for example, 30 nm to 35 nm and the same height is formed over the gate insulator film 22B.

In the device region 21A, n-type impurities, such as arsenicum (As) or phosphorus (P), are ion-implanted in the silicon substrate 21 using the polysilicon gate electrode 23A as a mask to form an n-type source extension region 21a on the first side of the gate electrode 23A and an n-type drain extension region 21b on the second side of the gate electrode 23A.

Similarly, in the device region 21B, p-type impurities, such as boron (B), are ion-implanted in the silicon substrate 21 using the polysilicon gate electrode 23B as a mask to form a p-type source extension region 21c on the first side of the gate electrode 23B and a p-type drain extension region 21d on the second side of the gate electrode 23A. The ion implantation may be performed whichever earlier in either the device regions 21A or the device region 21B. While ion implantation is performed in one of the device regions 21A and 21B, the other of the device regions 21A and 21B is covered with a resist mask (not shown).

A first offset sidewall spacer 23WA1 and a second offset sidewall spacer 23WA2 are formed of a CVD oxide film on the first sidewall and the second sidewall (opposite to the first sidewall) of the gate electrode 23A, respectively. The thickness of the first and second offset sidewall spacers 23WA1 and 23WA2 is typically 20 nm to 30 nm, and they cover the sidewalls of the gate electrode 23A from the bottom to the top. Similarly, a first offset sidewall spacer 23WB1 and a second offset sidewall spacer 23WB2 are formed on the first sidewall and the second sidewall (opposite to the first sidewall) of the gate electrode 23B, respectively, by etching back a CVD oxide film deposited over the silicon substrate. The first and second offset sidewall spacers 23WB1 and 23WB2 also cover the sidewalls of the gate electrode 23B from the bottom to the top.

Figure 6B:
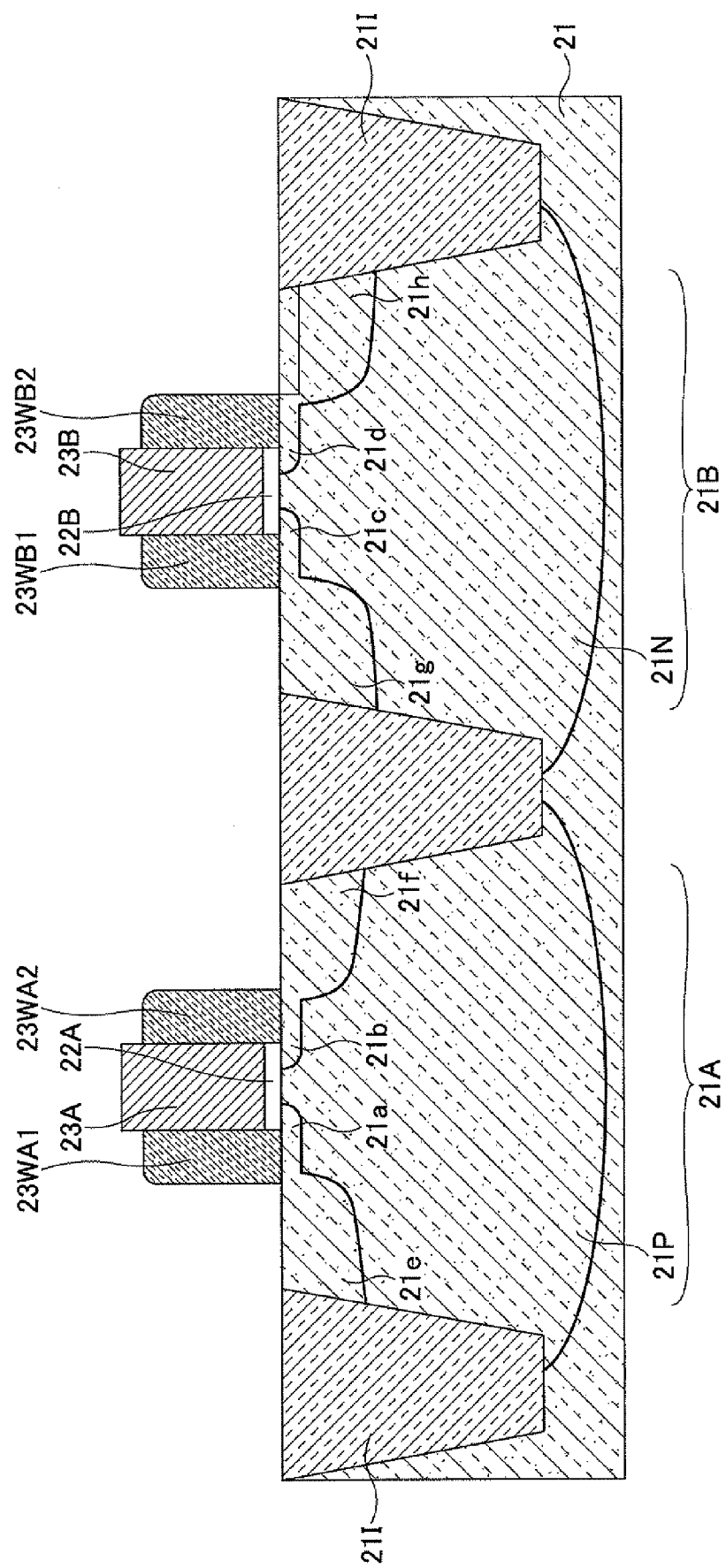
FIG. 6B is a schematic cross-sectional view showing a manufacturing process of a CMOS device according to the second embodiment of the invention.

Next, in FIG. 6B, n-type impurities, such as arsenicum (As) or phosphorus (P), are ion-implanted in the device region 21A using the combination of the polysilicon gate electrode 23A and the offset sidewalls 23WA1 and 23WA2 as a mask to form an $n^+$ type source region 21e and an $n^+$ type drain region 21g. The source and drain regions 21e and 21f are offset from the channel region directly below the gate electrode 23A and located outside the first and second offset sidewall spacers 23WA1 and 23WA2, respectively. During this step, the polysilicon gate electrode 23A is also doped with the $n^+$ type impurities.

Similarly, p-type impurities, such as boron (B), are ion-implanted in the device region 21B using the combination of the polysilicon gate electrode 23B and the offset sidewall spacers 23WB1 and 23WB2 as a mask to form a p+ type source region 21g and a p+ type drain region 21h. The source and drain regions 21g and 21h are offset from the channel region directly below the gate electrode 23B and located outside the first and second offset sidewall spacers 23WB1 and 23WB2, respectively. During this step, the polysilicon gate electrode 23B is also doped with the p+ type impurities.

The source/drain ion implantation may be performed earlier in either the device regions 21A or the device region 21B. While ion implantation is performed in one of the device regions 21A and 21B, the other of the device regions 21A and 21B is covered with a resist mask (not shown).

Figure 6C:
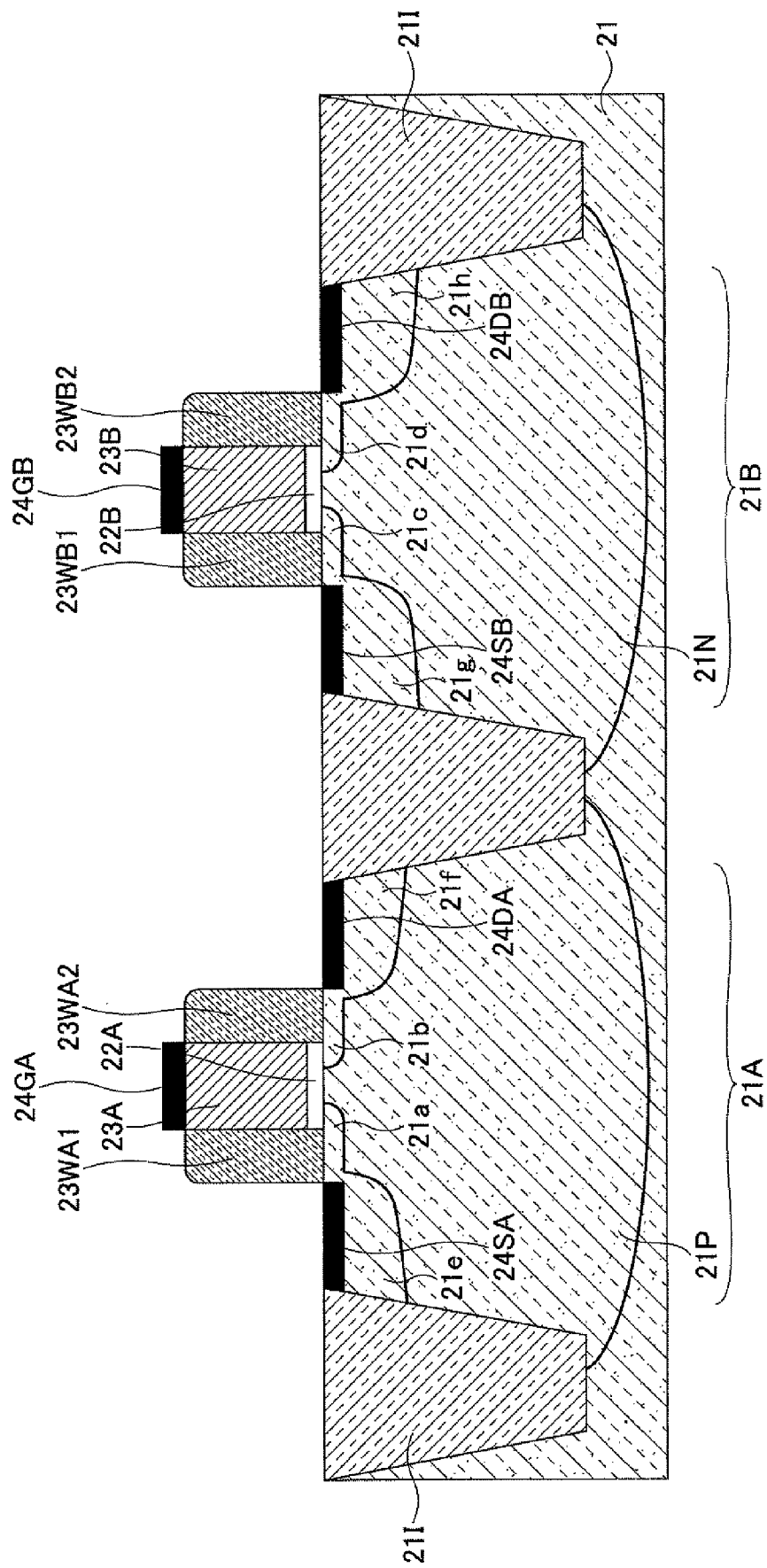
FIG. 6C is a schematic cross-sectional view showing a manufacturing process of a CMOS device according to the second embodiment of the invention.

Next, in FIG. 6C, a silicide is formed over the exposed silicon surface of the structure shown in FIG. 6B by a salicide process. As a result, the top surface of the polysilicon gate electrodes 23A and 23B, the surface of the source and drain regions 21e and 21f, and the surface of the source and drain regions 21g and 21h are covered with silicide films 24GA, 24GB, 24SA, 24DA, 24SB, and 24DB.

Figure 6D:
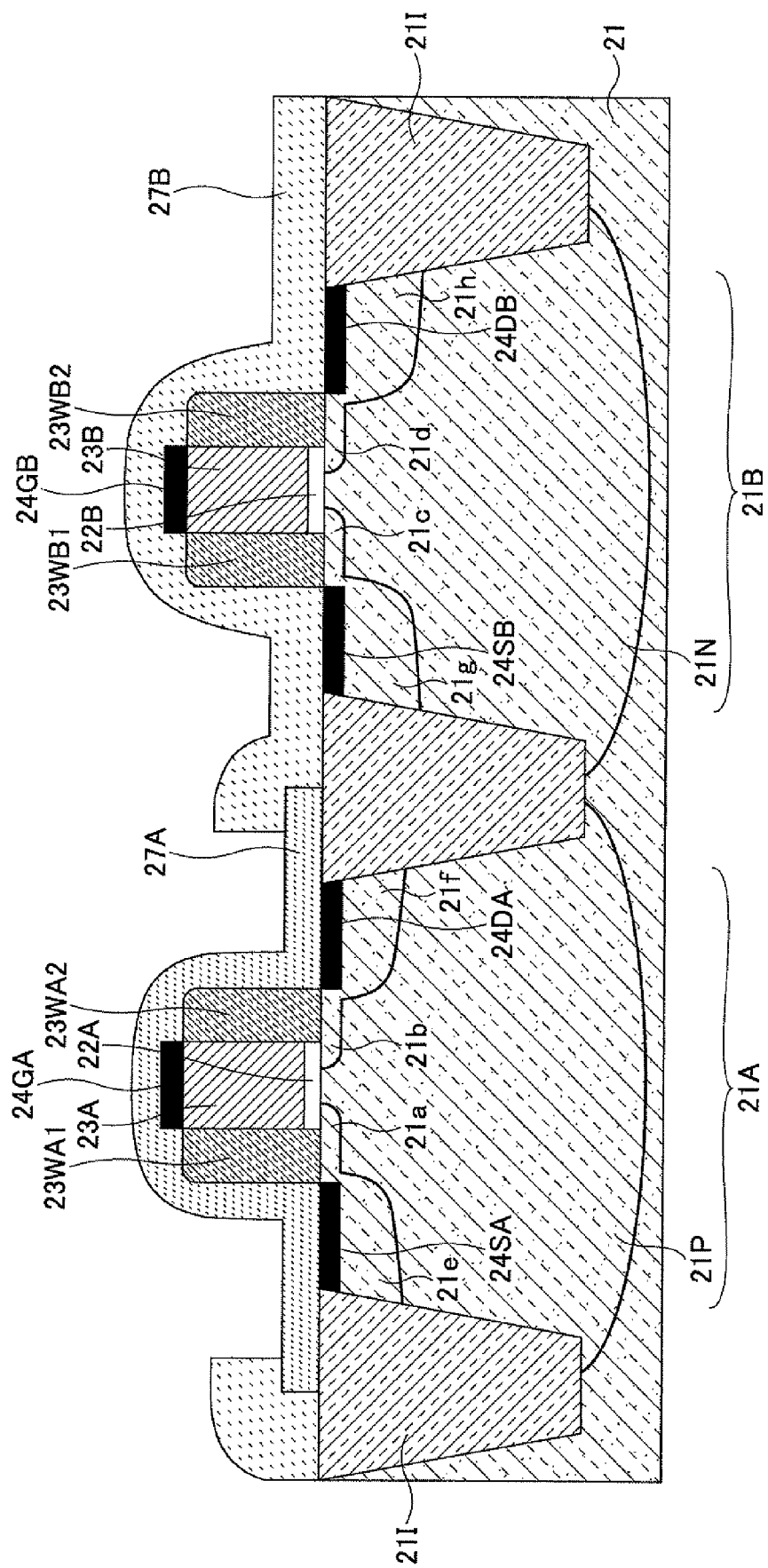
FIG. 6D is a schematic cross-sectional view showing a manufacturing process of a CMOS device according to the second embodiment of the invention.

Next, in FIG. 6D, a silicon nitride (SiN) layer 27A with a thickness of 20 nm to 80 nm is formed over the device regions 21A and 21B on the silicon substrate 21, and a part of the silicon nitride layer 27A that covers the device region 21B is removed by etching such that the SiN layer 27A remains only in the device region 21A. To be more specific, before the etching, the SiN layer 27A is formed so as to cover the device isolation region 21I, the silicide film 24SA over the source region 21e, the offset sidewall spacer 23WA1, the silicide film 24GA over the gate electrode 23A, the offset sidewall spacer 23WA2 and the silicide film 24DA over the drain region 21f, as well as covering the device isolation region 21I, the silicide film 24SB over the source region 21g, the offset sidewall spacer 23WB1, the silicide film 24GB over the gate electrode 23B, the offset sidewall spacer 23WB2 and the silicide film 24DB over the drain region 21h in the device region 21B. Then, the part of the SiN layer 27A located over the device region 21B is etched so as to expose the device region 21B.

Then, another silicon nitride (SiN) layer 27B with a thickness of 20 nm to 80 nm is formed over the device regions 21A and 21B on the silicon substrate 21, and a part of the SiN layer 27B that covers the device region 21A is removed by etching such that the SiN layer 29B remains only in the device region 21B. To be more specific, a SiN layer 27B is formed so as to cover the device isolation region 21I, the silicide film 24SB over the source region 21g, the offset sidewall spacer 23WB1, the silicide film 24GB over the gate electrode 23B, the offset sidewall spacer 23WB2 and the silicide film 24DB over the drain region 21h in the device region 21B, as well as covering the device isolation region 21I, the silicide film 24 SA over the source region 21e, the offset sidewall spacer 23WA1, the silicide film 24GA over the gate electrode 23A, the offset sidewall spacer 23WA2 and the silicide film 24DA over the drain region 21f. Then, the part of the SiN layer 27B located over the device region 21A is removed. As a result, the SiN layer 27B remains only in the device region 21B.

The SiN layer 27A is formed by a plasma CVD process, supplying source gases of dichlorosilane, silane ($SiH_4$), disilane ($Si_2H_6$) and trisilane ($Si_3H_8$) at a flow rate of 5 sccm to 50 sccm, together with ammonia ($NH_3$) gas at a flow rate of 500 sccm to 10000 sccm and nitrogen (N) or argon (Ar) gas at a flow rate of 500 sccm to 10000 sccm, under the conditions of a pressure of 13.33 Pas (0.1 Torr) to 53320 Pas (400 Torr), a temperature of 400° C. to 450° C., and application of a high-frequency power of 100 W to 300 W. The formed SiN layer 27A can accumulate a tensile stress of 1.5 GPa to 2.0 GPa.

On the other hand, the SiN layer 27B provided in the p-channel device region 21B is formed by a plasma CVD process, supplying source gas of silane ($SiH_4$) at a flow rate of 100 sccm to 1000 sccm, together with ammonia (NH3) gas at a flow rate of 500 sccm to 10000 sccm and nitrogen (N) or argon (Ar) gas at a flow rate of 500 sccm to 10000 sccm, under the conditions of a pressure of 13.33 Pas (0.1 Torr) to 53320 Pas (400 Torr), a temperature of 400° C. to 450° C., and application of a high-frequency power of 100 W to 1000 W. The formed SiN layer 27B can accumulate a compressive stress of 2.5 GPa to 3.5 GPa.

The sequence of the formations of the SiN layer 27A and the SiN layer 27B may be reversed.

Figure 6E:
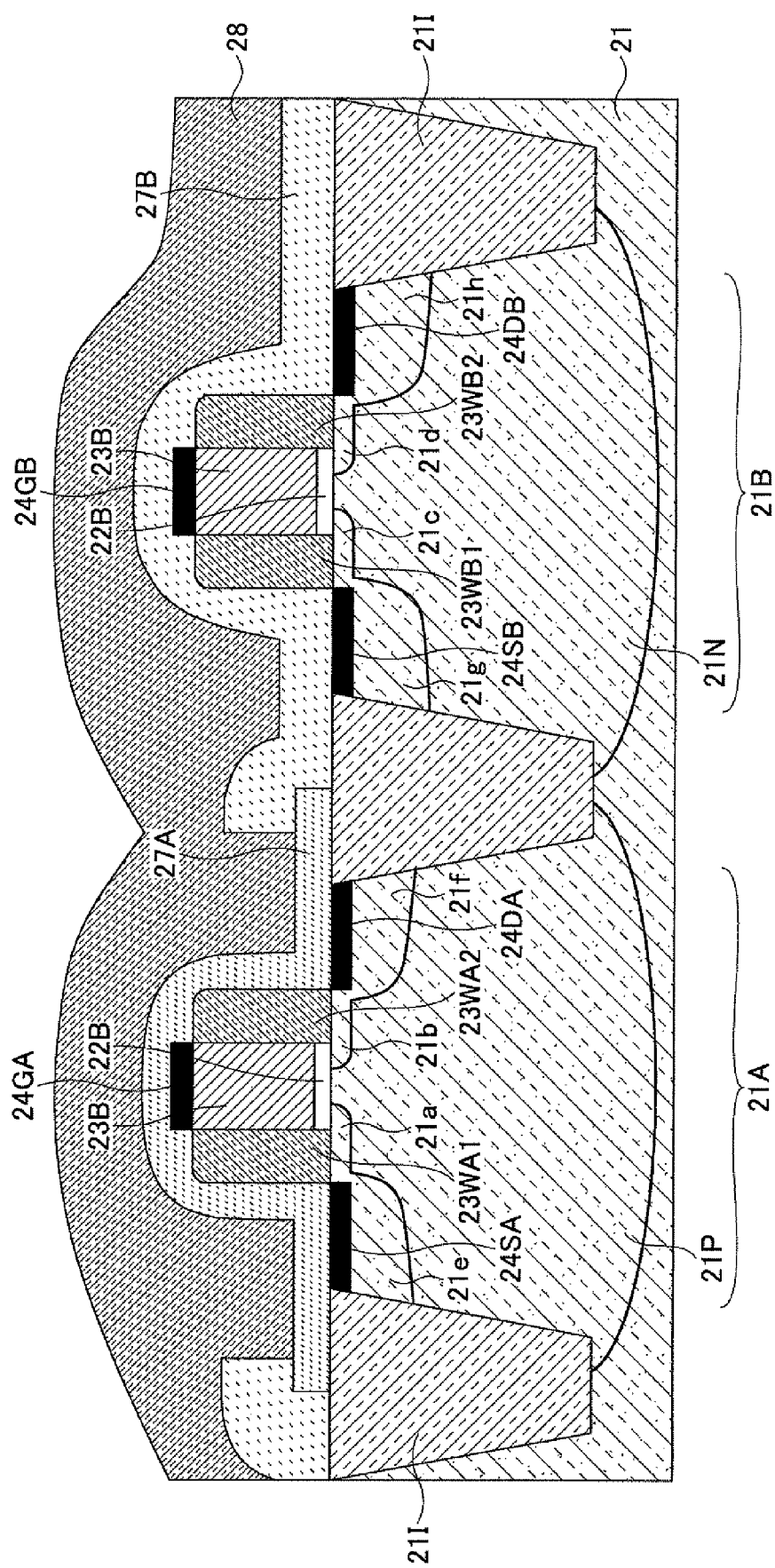
FIG. 6E is a schematic cross-sectional view showing a manufacturing process of a CMOS device according to the second embodiment of the invention.

Next, in FIG. 6E, a protection layer 28 is formed over of the silicon substrate 21 to continuously cover the device regions 21A and 21B. The protection layer 28 is, for example, a insulating layer, such as high density plasma (HDP) oxide layer. The protection layer 18 is formed by, for example, supplying a silane gas at a flow rate of 50 sccm to 500 sccm, together with oxygen gas at a flow rate of 200 sccm to 500 sccm and argon (Ar) gas at a flow rate of 1000 sccm, at a temperature of temperature of 300° C. to 400° C., and applying high density plasma power of 2000 W to 5000 W.

Next, in FIG. 6F, chemical mechanical polishing is performed on the protection layer 28 and the SiN layers 27A and 27B to expose the silicide films 24GA and 24GB over the gate electrodes 23A and 23B, respectively. In this process, top portions of the SiN layers 27A and 27B are also exposed.

Figure 6G:
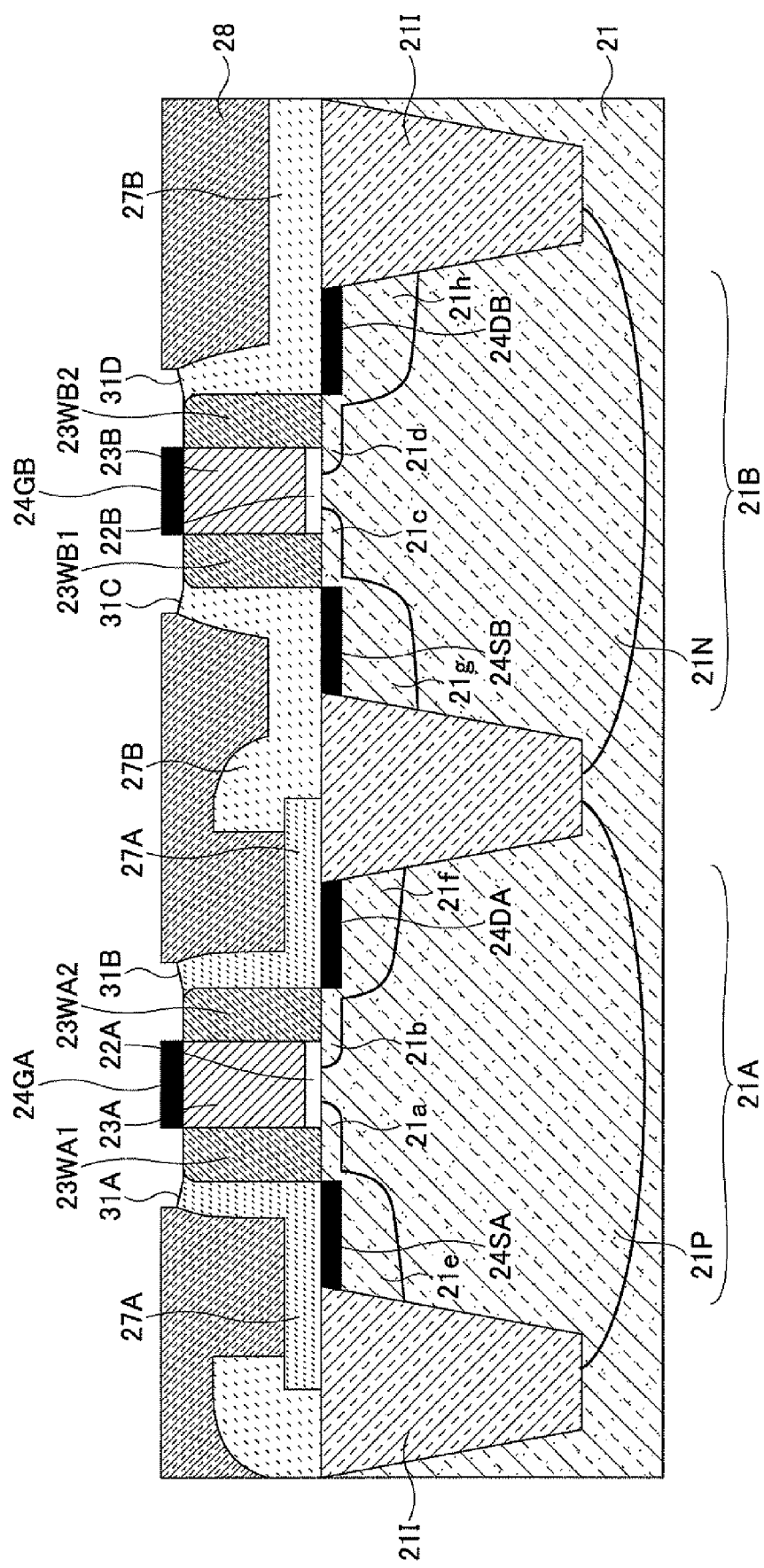
FIG. 6G is a schematic cross-sectional view showing a manufacturing process of a CMOS device according to the second embodiment of the invention.

Next, in FIG. 6G, top portions of the SiN layers 27A and 28B exposed around the silicide films 24GA and 24GB are removed by a reactive ion etching process using a mixture gas of $CHF_3/Ar/O_2$ to expose the top faces of the offset sidewall spacers 23WA1, 23WA2, 23WB1, and 23WB2. During this process, the SiN layer 27A is patterned so as to produce a first extending part 31A rising upward along the offset sidewall spacer 23WA1 and a second extending part 31B rising upward along the offset sidewall spacer 23WA2 in the device region 21A. The first extending part 31A rises from the bottom part of the SiN layer 27A extending from the device isolation region (on the left-hand side of figure) to the right toward the gate electrode 23A on the silicon substrate 21. The second extending part 31B rises from the bottom part of the SiN layer 27A extending from the device isolation region (at the center of figure) to the left toward the gate electrode 23A on the silicon substrate 21.

Similarly, during this RIE process, the SiN layer 27B is patterned so as to produce a first extending part 31C rising upward along the offset sidewall spacer 23WB1 and a second extending part 31D rising upward along the offset sidewall spacer 23WB2 in the device region 21B. The first extending part 31C rises from the bottom part of the SiN layer 27B extending from the device isolation region (at the center of figure) to the right toward the gate electrode 23B on the silicon substrate 21. The second extending part 31D rises from the bottom part of the SiN layer 27B extending from the device isolation region (on the right-hand side of figure) to the left toward the gate electrode 23B on the silicon substrate 21.

Figure 6H:
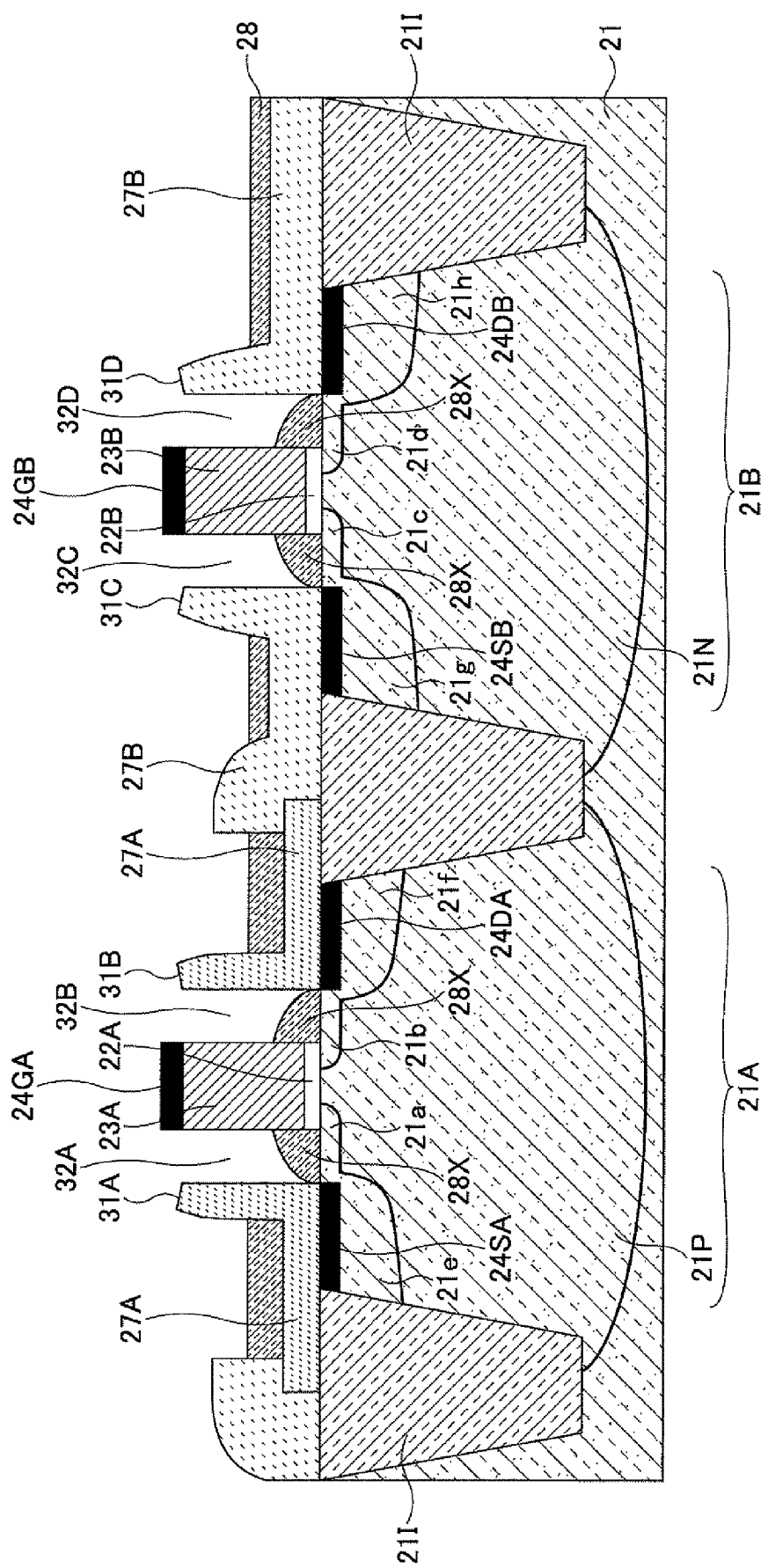
FIG. 6H is a schematic cross-sectional view showing a manufacturing process of a CMOS device according to the second embodiment of the invention.

Next, in FIG. 6H, the offset sidewall spacers 23WA1, 23WA2, 23WB1, and 23WB2 are removed from the top faces thereof by a wet etching process or a reactive ion etching process using a mixture gas of $C_4F_8/Ar/O_2$. As a result, gaps 32A, 32B, 32C, and 32D are formed between the first-side sidewall of the gate electrode 23A and the extending part 31A, between the second-side sidewall of the gate electrode 23A and the extending part 31B, between the first-side sidewall of the gate electrode 23B and the extending part 31C, and between the second-side sidewall of the gate electrode 23B and the extending part 31D, respectively. With this arrangement, a tensile stress Sxx is applied to the channel region directly below the gate electrode 23A, and a compressive stress −Sxx is applied to the channel region directly below the gate electrode 23B, as has been explained in conjunction with FIG. 1 through FIG. 5.

It is desired for the wet etching process used in FIG. 6H to completely remove the offset sidewall spacers 23WA1, 23WA2, 23WB1, and 23WB2. However, a certain amount of residual 28X may remain on the silicon substrate 21 in the corresponding gaps because the gap width between the gate electrode 23A and the extending parts 31A and 31B, or the gap width between the gate electrode 23B and the extending parts 31C and 31D is only 2 nm to 3 nm, compared to the thickness of 2 nm to 3 nm of the offset sidewall spacers 23WA1, 23WA2, 23WB1, and 23WB2. The influence of the residual 28X will be discussed below in conjunction with FIG. 7A.

Due to the etching process of FIG. 6H, the thickness of the protection layer 28 is also reduced.

Figure 6I:
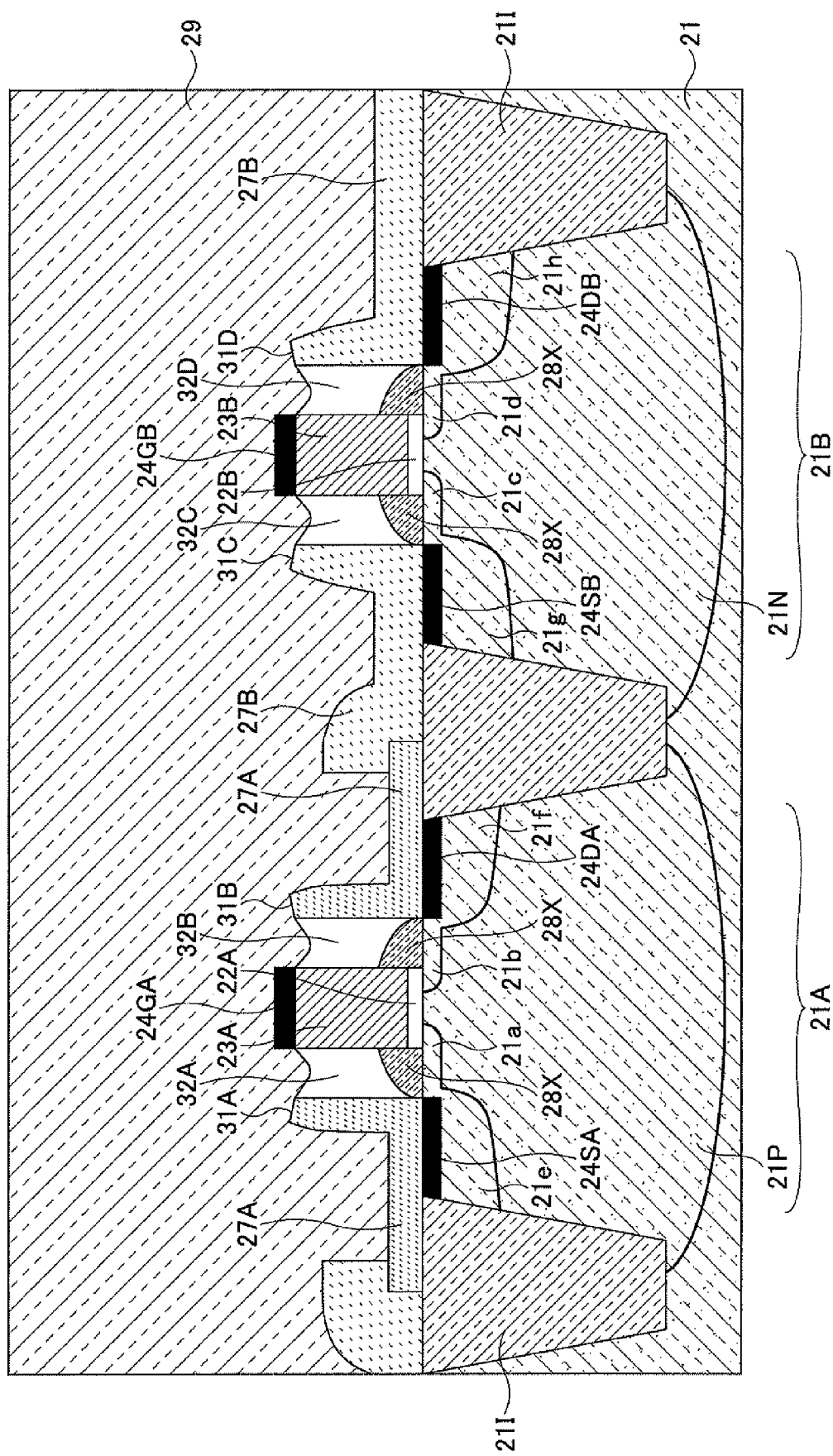
FIG. 6I is a schematic cross-sectional view showing a manufacturing process of a CMOS device according to the second embodiment of the invention.

Next, in FIG. 6I, an interlayer dielectric film 29 is formed over the entire structure shown in FIG. 6H using a high density plasma CVD process by, for example, supplying a silane gas at a flow rate of 50 sccm to 500 sccm, an oxygen gas at a flow rate of 200 sccm to 500 sccm, and an argon (Ar) gas at a flow rate of 1000 sccm, and applying a high density plasma power of 2000 W to 5000 W at a temperature of 300° C. to 450° C. The formed interlayer dielectric film 29 is then planarized by a CMP process. Employing a high density plasma CVD process to form the interlayer dielectric film 29 can prevent the gaps 32A through 32D from being filled with the interlayer dielectric materials because of the low step coverage of the process. The resultant interlayer dielectric film 29 is a stressless layer in which no substantive stress is accumulated.

Figure 6J:
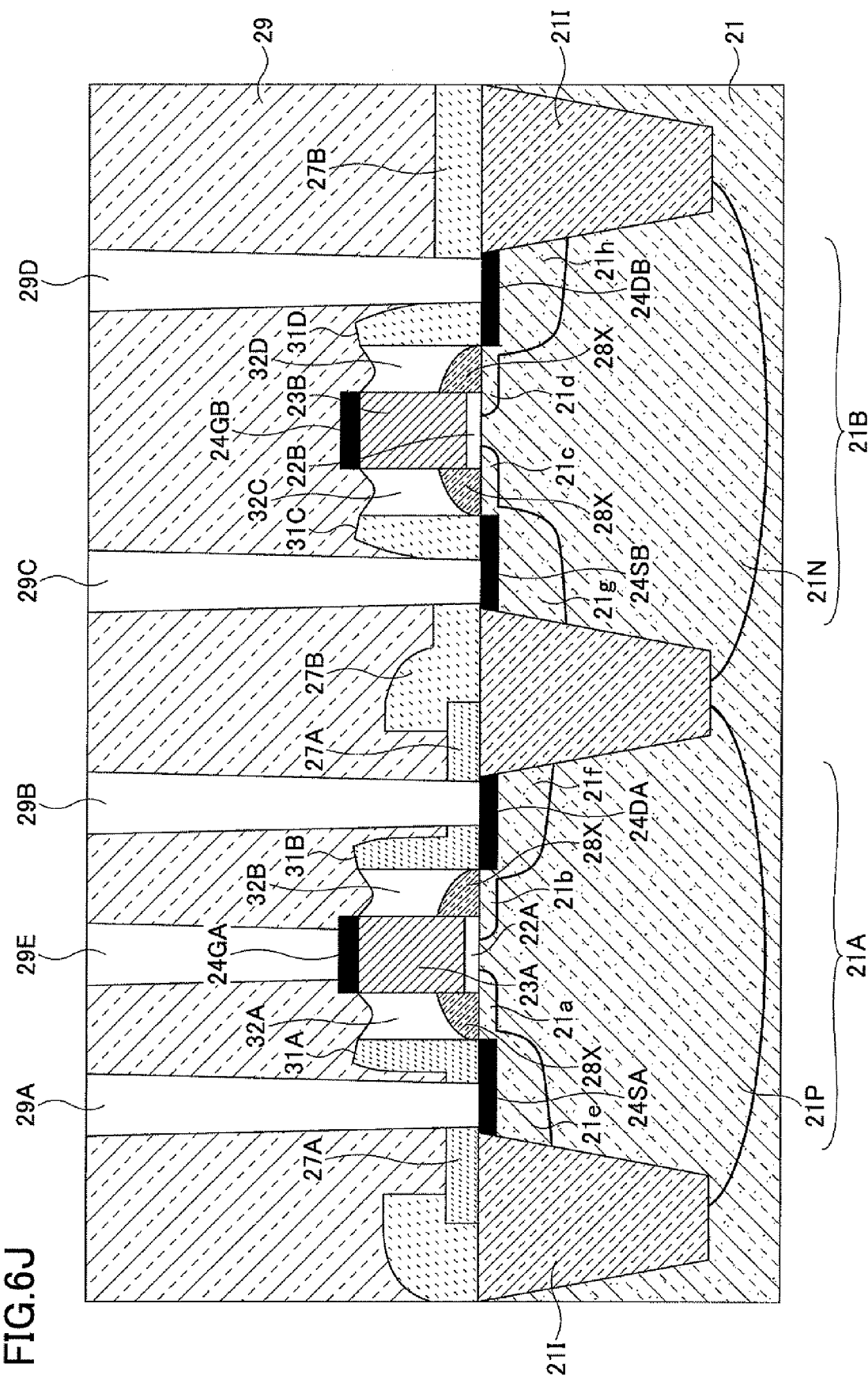
FIG. 6J is a schematic cross-sectional view showing a manufacturing process of a CMOS device according to the second embodiment of the invention.
Figure 6K:
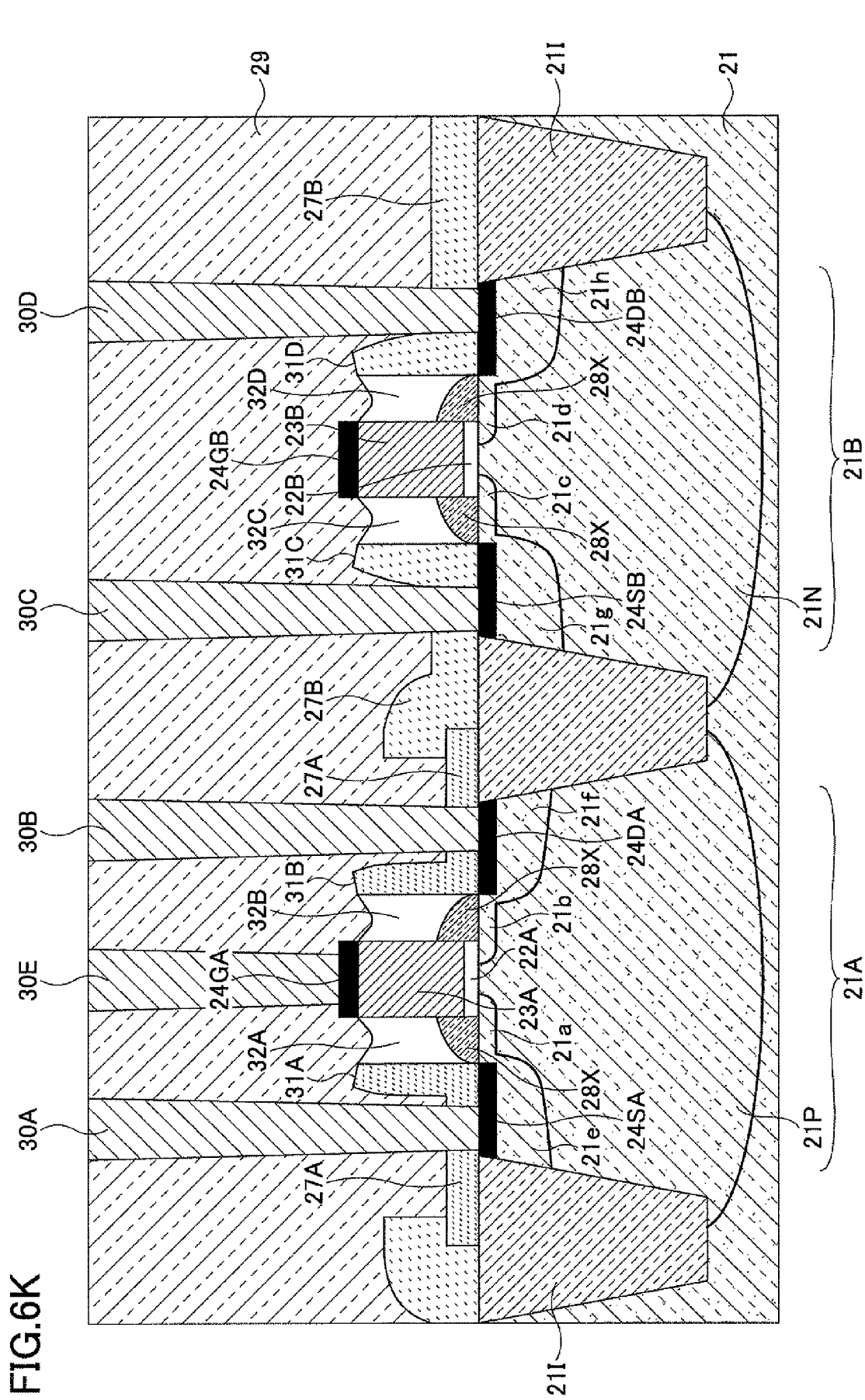
FIG. 6K is a schematic cross-sectional view showing a manufacturing process of a CMOS device according to the second embodiment of the invention.

Next, in FIG. 6J, via-holes 29A, 29B, 29C, and 29D are formed in the interlayer dielectric film 29 to expose the silicide film 24SA covering the source region 21e, the silicide film 24DA covering the drain region 21f, the silicide film 24SB covering the source region 32g and the silicide film 24DB covering the drain region 23h. In addition, a via-hole 29E for exposing the silicide film 24GA covering the polysilicon gate electrode 23A and a via-hole (not shown) for exposing the silicide film 24GB covering the polysilicon gate electrode 23B are formed in the interlayer dielectric film 29. Then, in FIG. 6K, via-plugs 30A through 30E are formed in the via-holes 29A through 29E.

Figure 7A:
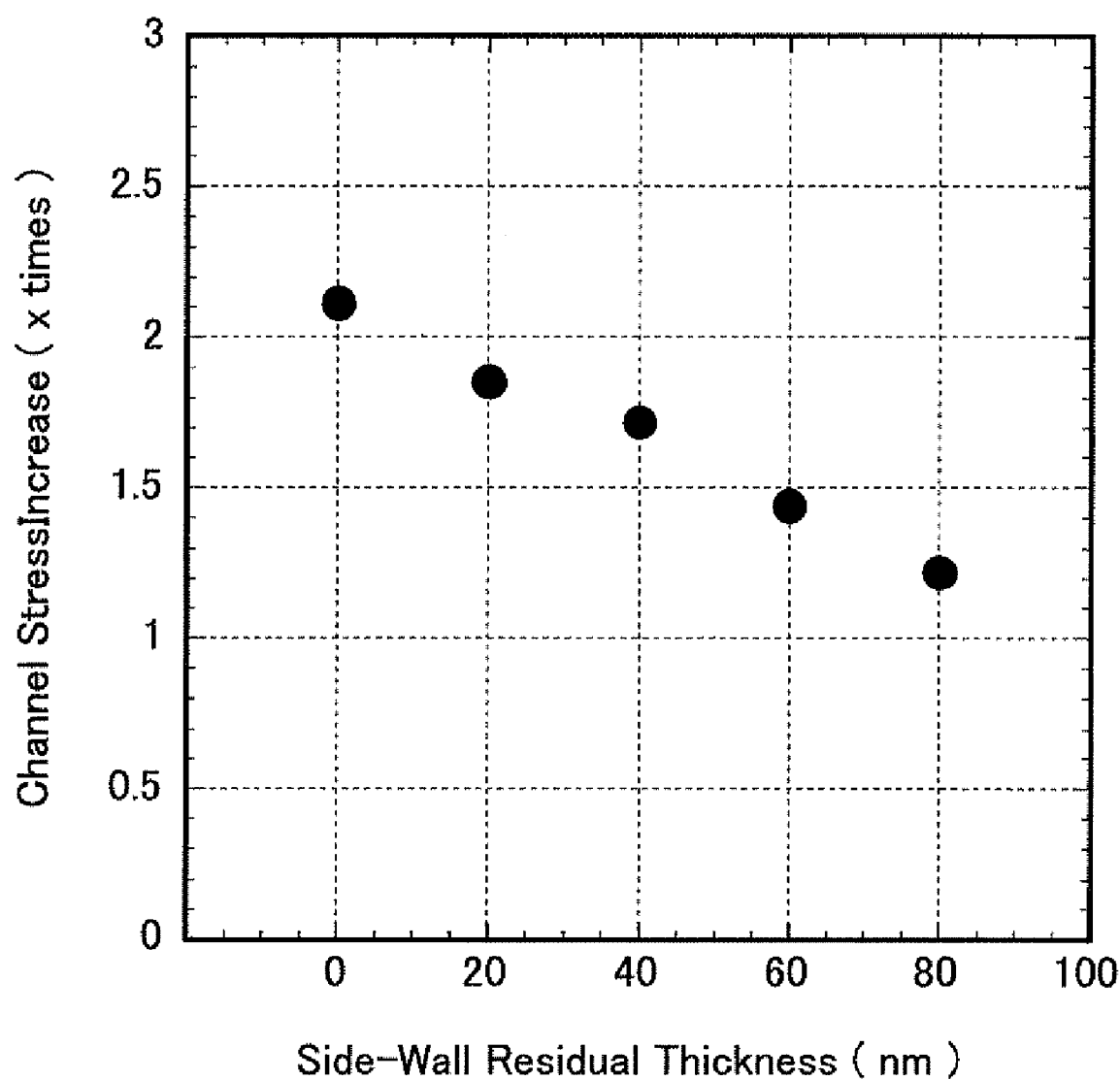
FIG. 7A is a graph analyzing influence of the residual film remaining in the gap.
Figure 7B:
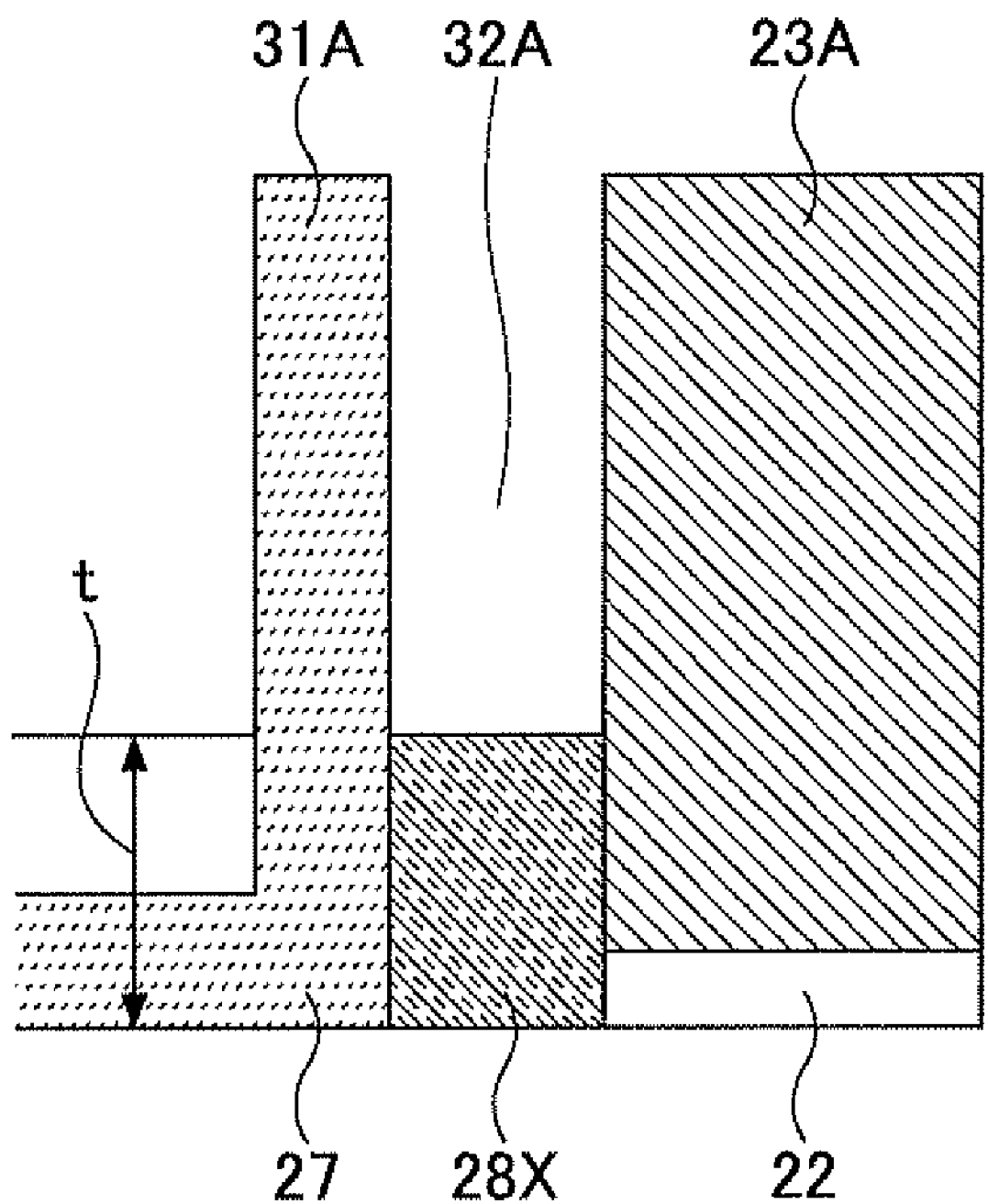
FIG. 7B is a schematic diagram showing a model structure used in the analysis of FIG. 7A.

FIG. 7A is a graph showing a simulation result of the influence on the channel stress due to the residual 28X remaining in the gaps 32A through 32D using a structure shown in FIG. 7B. The horizontal axis represents the thickness "t" of the residual 28X shown in FIG. 7B, and the vertical axis represents an increase in the magnitude of the channel stress Sxx as a function of the thickness of the residual 28X with the thickness of 100 nm as a reference point.

As the thickness of the residual 28X decreases, the channel stress increases. Without the residual 28X (that is, the thickness t=0), the channel stress almost doubles, compared to that of the reference thickness of 100 nm. It is understood from the simulation result of FIG. 7A that if a residual remains in the gaps 32A through 32D, the thickness of the residual in the gaps 32A through 32D is preferably 30 nm or less.

Figure 8:
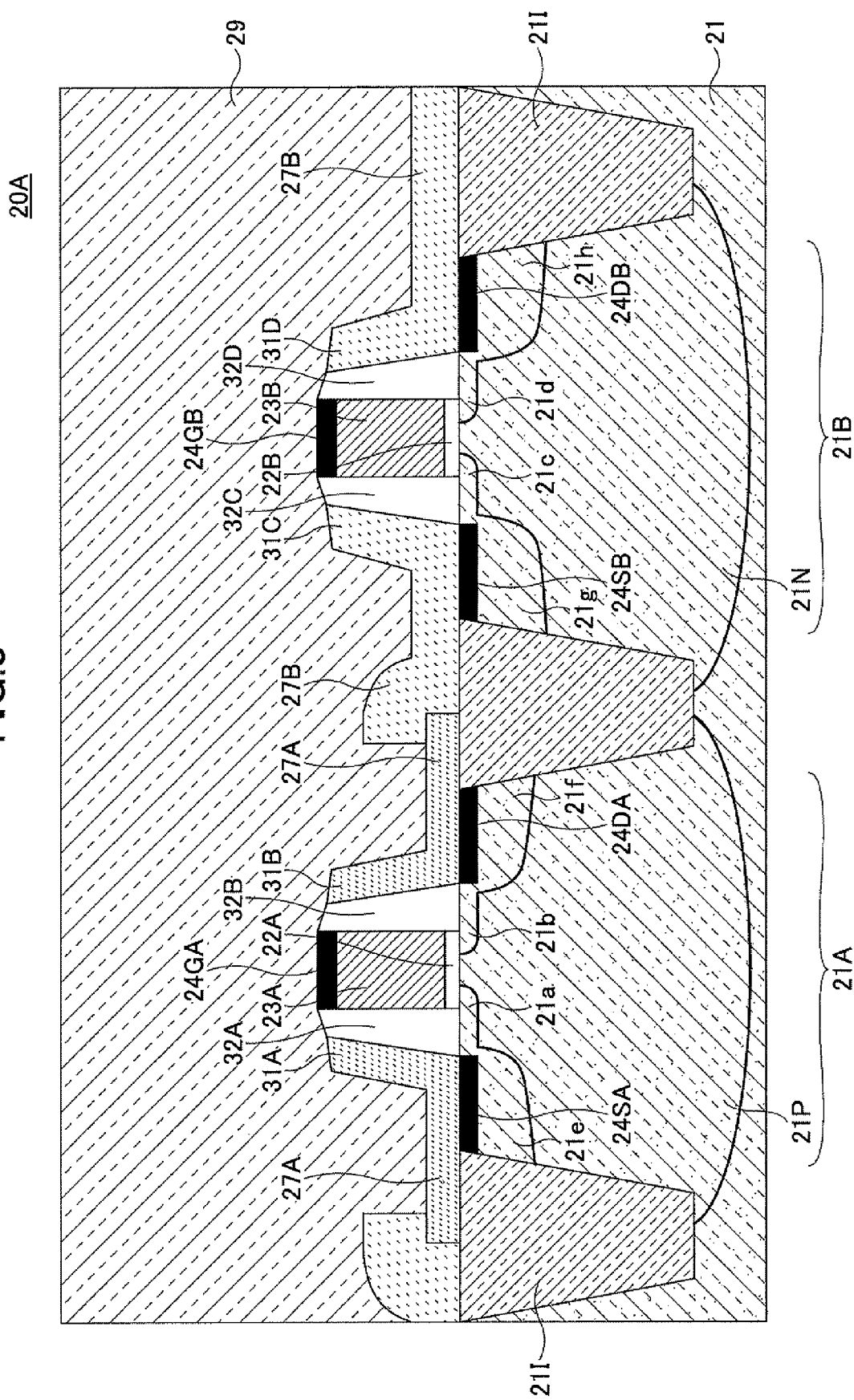
FIG. 8 is a schematic cross-sectional view of a modification of the CMOS device according to the second embodiment.

FIG. 8 is a schematic cross-sectional view of a CMOS device 20A according to a modification of the embodiment. The same components as those previously presented are denoted by the same numerical symbols, and explanation for them is omitted.

In the modification show in FIG. 8, the cross-sectional shape of each of the gaps 32 through 32D is trapezoidal with the top narrower than the bottom. This shape can be achieved by setting the thickness of the CVD insulating layer greater to a certain extent prior to forming the offset sidewall spacers 23WA1, 23WA2, 23WB1 and 23WB2, such that the CVD insulating layer covers the gate electrodes 23A and 23B with inclined surfaces in such a manner that the thickness of the CVD insulating layer on the sidewall of the gate electrode increases from the top toward the bottom. By etching back the CVD insulating layer with an inclined surface vertical to the surface of the substrate, the offset sidewall spacers 23WA1, 23WA2, 23WB1 and 23WB2, each having a tapered cross sectional shape with the thickness decreasing from the bottom toward the top can be obtained.

When removing the offset sidewall spacers 23WA1, 23WA2, 23WB1 and 23WB2 having trapezoidal cross-sections by an etching process, the gaps 32A through 32D, each having a trapezoidal cross-section with the width decreasing from the bottom (near the silicon substrate) toward the top (away from the silicon substrate), are produced. This arrangement is advantageous because when forming the interlayer dielectric film 29, the gaps 32A through 32D are prevented from being filled with the interlayer dielectric film 29.

Figure 9:
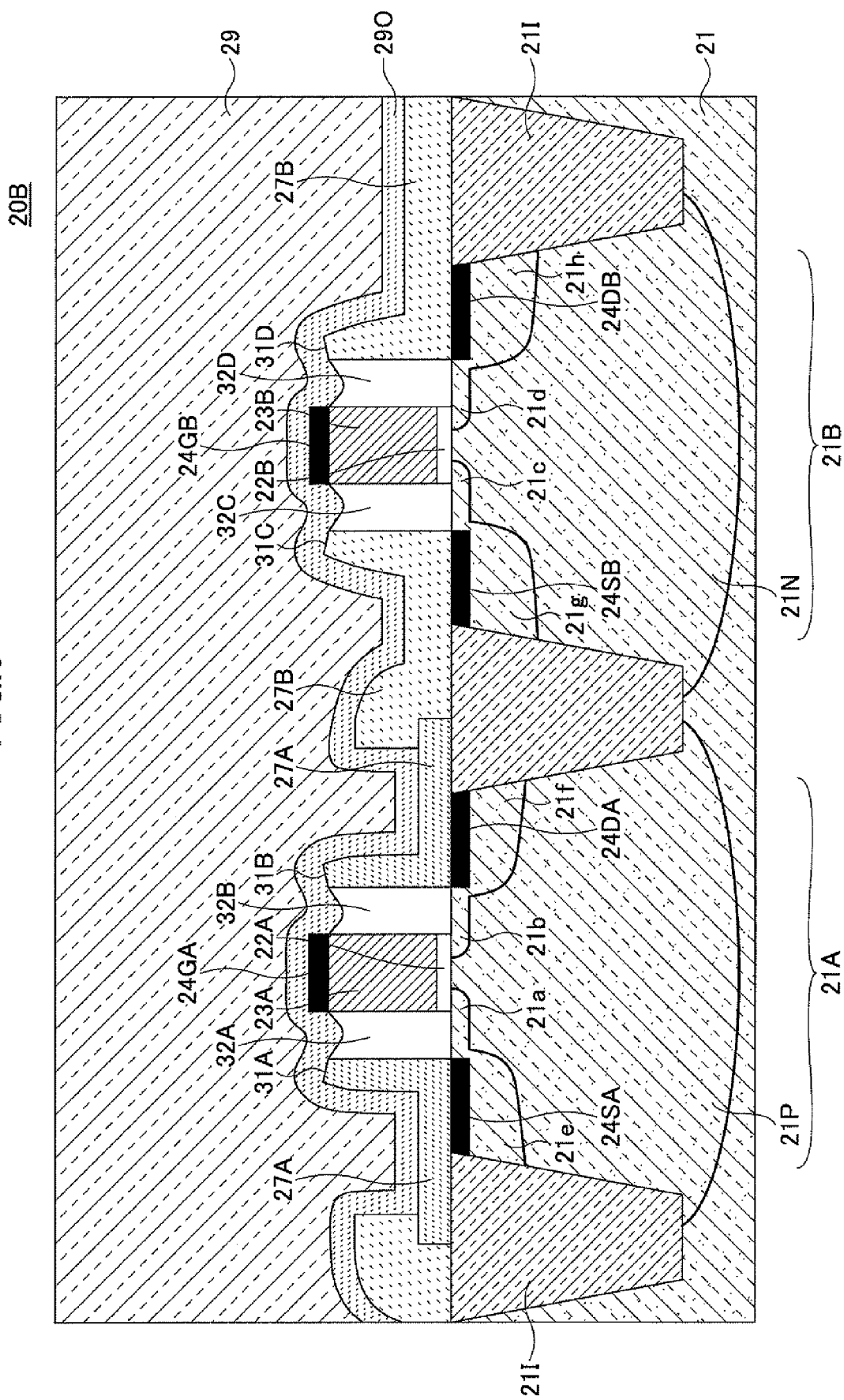
FIG. 9 is a schematic cross-sectional view of another modification of the CMOS device according to the second embodiment.

FIG. 9 is a schematic cross sectional view of a CMOS device 20B according to another modification of the embodiment. The same components as those previously presented are denoted by the same numerical symbols, and explanation for them is omitted. The structure of FIG. 9 is suitable when using an ordinary CVD oxide layer with good step coverage for the interlayer dielectric film 29. In this case, after the step of FIG. 6H and before the step of FIG. 6I, a cover layer (insulating layer) 290 with poor step coverage is formed over the entire structure shown in FIG. 6H by a high density plasma CVD process. The deposition of the cover layer 290 is carried out for a short period of time in order to maintain the thickness of the cover layer 290 substantially uniform. Then the interlayer dielectric film 29 with good step coverage is formed over the cover layer 290. This arrangement can also prevent the gaps 32A through 32D from being filled with the interlayer dielectric materials.

Figure 10:
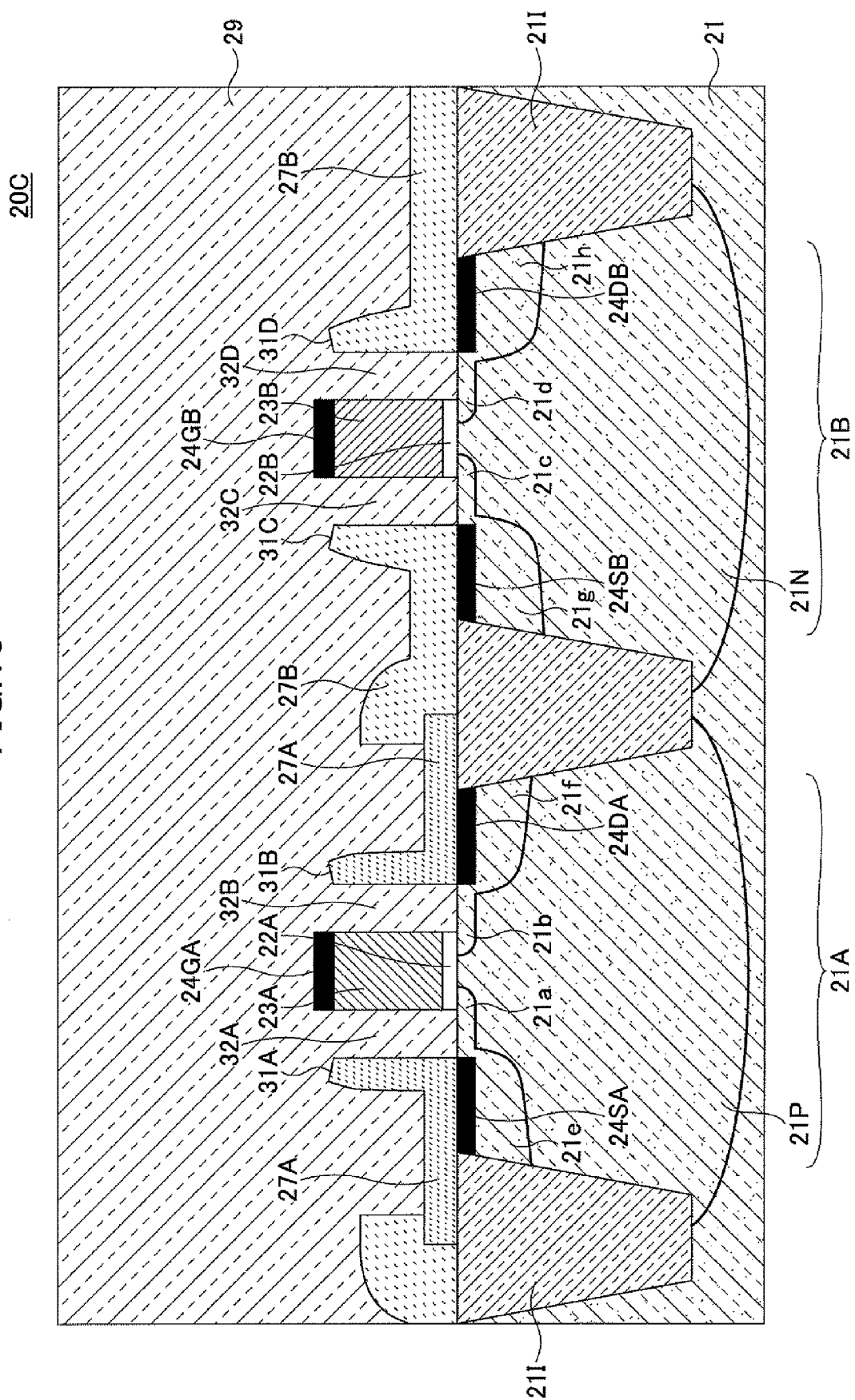
FIG. 10 is a schematic cross-sectional view of still another modification of the CMOS device according to the second embodiment.

FIG. 10 is a schematic cross-sectional view of still another modification of a CMOS device 20C. This modification shown in FIG. 10 can be applied to a structure in which the interlayer dielectric film 29 is a stressless layer because the gaps 32A through 32D are completely filled with the interlayer dielectric film 29. Such a stressless interlayer dielectric film 29 can be formed by a CVD method or an ALD method.

Although the preferred embodiments have been explained above, the present invention is not limited to the particular embodiments, and there are many substitutions and alterations within the scope of the inventions defined by the appended claims.

This patent application is based on Japanese Priority Patent Application No. 2010-142936 filed on Jun. 23, 2010, the entire contents of which are hereby incorporated by reference.

What is claimed is:

1. A MOS transistor, comprising:
a silicon substrate in which a device region is defined by a device isolation region;
a gate electrode formed over the silicon substrate in the device region and providing a channel region in the silicon substrate;
a source extension region and a drain extension region formed in the silicon substrate on a first side of the channel region and a second side of the channel region, respectively, in the device region, the source extension region and the drain extension region being of a first conductivity type corresponding to one of an n-type and a p-type;
a first conductivity-type source region formed in the silicon substrate on said first side of the channel region in the device region so as to be apart from the channel region and overlap a part of the source extension region;
a first conductivity-type drain region formed in the silicon substrate on said second side of the channel region in the device region so as to be apart from the channel region and overlap a part of the drain extension region;
a first stress layer formed over the silicon substrate in the device region so as to cover the source region and extend from the device isolation region toward the channel region on said first side of the channel region, the first stress layer accumulating a first stress corresponding to one of a tensile stress and a compressive stress;
a second stress layer formed over the silicon substrate in the device region so as to cover the drain region and extend from the device isolation region toward the channel region on said second side of the channel region, the second stress layer accumulating said first stress;
a silicide film formed on the gate electrode; and
a dielectric film formed directly on the silicide film, and covering the gate electrode, the first stress layer, and the second stress layer, wherein a material of the dielectric film is different from a material of the first stress layer and a material of the second stress layer,
said first stress layer having a first extending part rising from an end of the first stress layer near the channel region upward from the silicon substrate along a first sidewall of the gate electrode but separated from the first sidewall of the gate electrode,
said second stress layer having a second extending part rising from an end of the second stress layer near the channel region upward from the silicon substrate along a second sidewall of the gate electrode but separated from the second sidewall of the gate electrode,
said first stress being the tensile stress if the first conductivity type is the n-type, and said first stress being the compressive stress if the first conductivity type is the p-type.

2. The MOS transistor according to claim 1, wherein a first gap is provided between the first sidewall of the gate electrode and the first extending part of the first stress layer, and a second gap is provided between the second sidewall of the gate electrode and the second extending part of the second stress layer, the first gap and the second gap being located under the dielectric film.

3. The MOS transistor according to claim 2, wherein a gap size of each of the first gap and the second gap in a direction of a channel length decreases from a bottom near the silicon substrate toward a top away from the silicon substrate.

4. The MOS transistor according to claim 2, wherein a first residual of a first offset sidewall spacer provided to the first sidewall of the gate electrode remains at a bottom of the first gap, and a second residual of a second offset sidewall spacer provided to the second sidewall of the gate electrode remains at a bottom of the second gap, and
a height of the first and second residuals from a surface of the silicon substrate is at or below 40% of a height of the gate electrode.

5. The MOS transistor according to claim 2,
wherein the dielectric film is stressless.

6. The MOS transistor according to claim 5, wherein a thickness of the dielectric film is uniform.

7. The MOS transistor according to claim 1, wherein a space between the first sidewall of the gate electrode and the first extending part of the first stress layer and a space between the second sidewall of the gate electrode and the second extending part of the second stress layer are filled with a stressless layer that does not accumulate a stress therein.

8. A semiconductor device comprising:
- a silicon substrate in which a first device region and a second device region are defined by a device isolation region;
- an n-channel MOS transistor formed in the first device region; and
- a p-channel MOS transistor formed in the second device region,
- the n-channel MOS transistor including:
  - a first gate electrode formed over the silicon substrate in the first device region and providing a first channel region in the silicon substrate;
  - an n-type source extension region and an n-type drain extension region formed in the silicon substrate on a first side and a second side of the first channel region, respectively, in the first device region;
  - an n-type source region formed in the silicon substrate on said first side of the first channel region in the first device region so as to be apart from the first channel region and overlap a part of the n-type source extension region;
  - an n-type drain region formed in the silicon substrate on said second side of the first channel region in the first device region so as to be apart from the first channel region and overlap a part of the n-type drain extension region;
  - a first tensile stress layer formed over the silicon substrate in the first device region so as to cover the n-type source region and extend from the device isolation region toward the first channel region on said first side of the first channel region; and
  - a second tensile stress layer formed over the silicon substrate in the first device region so as to cover the n-type drain region and extend from the device isolation region toward the first channel region on said second side of the first channel region,
  - said first tensile stress layer having a first extending part rising from an end of the first tensile stress layer near the first channel region upward from the silicon substrate along a first sidewall of the first gate electrode but separated from the first sidewall of the first gate electrode on said first side of the first channel region, and
  - said second tensile stress layer having a second extending part rising from an end of the second tensile stress layer near the channel region upward from the silicon substrate along a second sidewall of the first gate electrode but separated from the second sidewall of the first gate electrode on said second side of the first channel region,
- the p-channel MOS transistor including:
  - a second gate electrode formed over the silicon substrate in the second device region and providing a second channel region in the silicon substrate;
  - a p-type source extension region and a p-type drain extension region formed in the silicon substrate on a first side and a second side of the second channel region, respectively, in the second device region;
  - a p-type source region formed in the silicon substrate on said first side of the second channel region in the second device region so as to be apart from the second channel region and overlap a part of the p-type source extension region;
  - a p-type drain region formed in the silicon substrate on said second side of the second channel region in the second device region so as to be apart from the second channel region and overlap a part of the p-type drain extension region;
  - a first compressive stress layer formed over the silicon substrate in the second device region so as to cover the p-type source region and extend from the device isolation region toward the second channel region on said first side of the second channel region; and
  - a second compressive stress layer formed over the silicon substrate in the second device region so as to cover the p-type drain region and extend from the device isolation region toward the second channel region on said second side of the second channel region,
  - said first compressive stress layer having a third extending part rising from an end of the first compressive stress layer near the second channel region upward from the silicon substrate along a first sidewall of the second gate electrode but separated from the first sidewall of the second gate electrode on said first side of the second channel region, and
  - said second compressive stress layer having a fourth extending part rising from an end of the second compressive stress layer near the second channel region upward from the silicon substrate along a second sidewall of the second gate electrode but separated from the second sidewall of the second gate electrode on said second side of the second channel region,
- the semiconductor device further including
- a first silicide film on the first gate electrode;
- a second silicide film on the second gate electrode; and
- a dielectric film formed directly on the first silicide film and the second silicide film, and covering the first gate electrode, the second gate electrode, the first tensile stress layer, the second tensile stress layer, the first compressive stress layer, and the second compressive stress layer, wherein a material of the dielectric film is different from a material of the first tensile stress layer, a material of the second tensile stress layer, a material of the first compressive layer, and a material of the second compressive stress layer.

* * * * *